United States Patent [19]
Wright, Jr.

[11] Patent Number: 4,748,684
[45] Date of Patent: May 31, 1988

[54] FAST TUNING CONTROL FOR A TELEVISION SYSTEM

[75] Inventor: W. Andrew Wright, Jr., Bethlehem, Pa.

[73] Assignee: Information Resources, Inc., Chicago, Ill.

[21] Appl. No.: 65,640

[22] Filed: Jun. 29, 1987

Related U.S. Application Data

[63] Continuation of Ser. No. 870,223, Jun. 3, 1986, abandoned.

[51] Int. Cl.$^4$ .............................................. H04B 1/16
[52] U.S. Cl. ................................... 455/182; 455/186; 455/200; 358/195.1
[58] Field of Search ............... 455/173, 182, 185, 186, 455/200; 358/191.1, 195.1

[56] References Cited

U.S. PATENT DOCUMENTS

| | | | |
|---|---|---|---|
| 4,079,320 | 3/1978 | Mogi | 325/420 |
| 4,085,371 | 4/1978 | Mogi et al. | 325/464 |
| 4,100,578 | 7/1978 | Arneson | 455/182 |
| 4,220,922 | 9/1980 | Ikeguchi | 455/182 |
| 4,241,449 | 12/1980 | Tanaka | 455/200 |
| 4,247,952 | 1/1981 | Shibuya | 455/186 |
| 4,298,988 | 11/1981 | Dages | 455/182 |
| 4,355,414 | 10/1982 | Inoue | 455/200 |
| 4,476,584 | 10/1984 | Dages | 455/182 |
| 4,491,975 | 1/1985 | Ito | 455/186 |
| 4,525,866 | 6/1985 | Templin | 455/186 |
| 4,630,118 | 12/1986 | Suzuki | 455/182 |

*Primary Examiner*—Michael A. Masinick
*Attorney, Agent, or Firm*—Fitch, Even, Tabin & Flannery

[57] ABSTRACT

A fast tuning subsystem includes a tuner for selecting a channel, with a voltage controlled oscillator having a control input for determining the channel frequency the tuner selectively receives. A predictor supplies a selected predicted voltage signal from memory to the control input of the oscillator to slew the channel frequency at a rapid slew rate to the frequency corresponding to the selected predicted voltage signal. An error detector generates a tuning error signal indicative of the tuning error of the tuner off the frequency for the selected channel. The tuning error signal is combined with the selected predicted voltage signal to provide a control signal for adjusting the channel frequency to reduce the tuning error. The subsystem also similarly controls the amplitude of the received channel. The tuning subsystem automatically and from time to time changes the signals stored in the memory for respective channels to signals corresponding to the control signals applied after long term feedback. The feedback provides successively a correction mode and a station-keeping mode. The correction mode provides correction of any error in tuning of an acquired channel fast enough that the correction is substantially imperceptible to the eye and any residual error is substantially imperceptible to the eye. The station-keeping mode operates slowly enough to filter out noise and spurious signals and maintain any residual error below a predetermined limit over long periods of time.

17 Claims, 15 Drawing Sheets

RF FREQUENCY CONVERTER

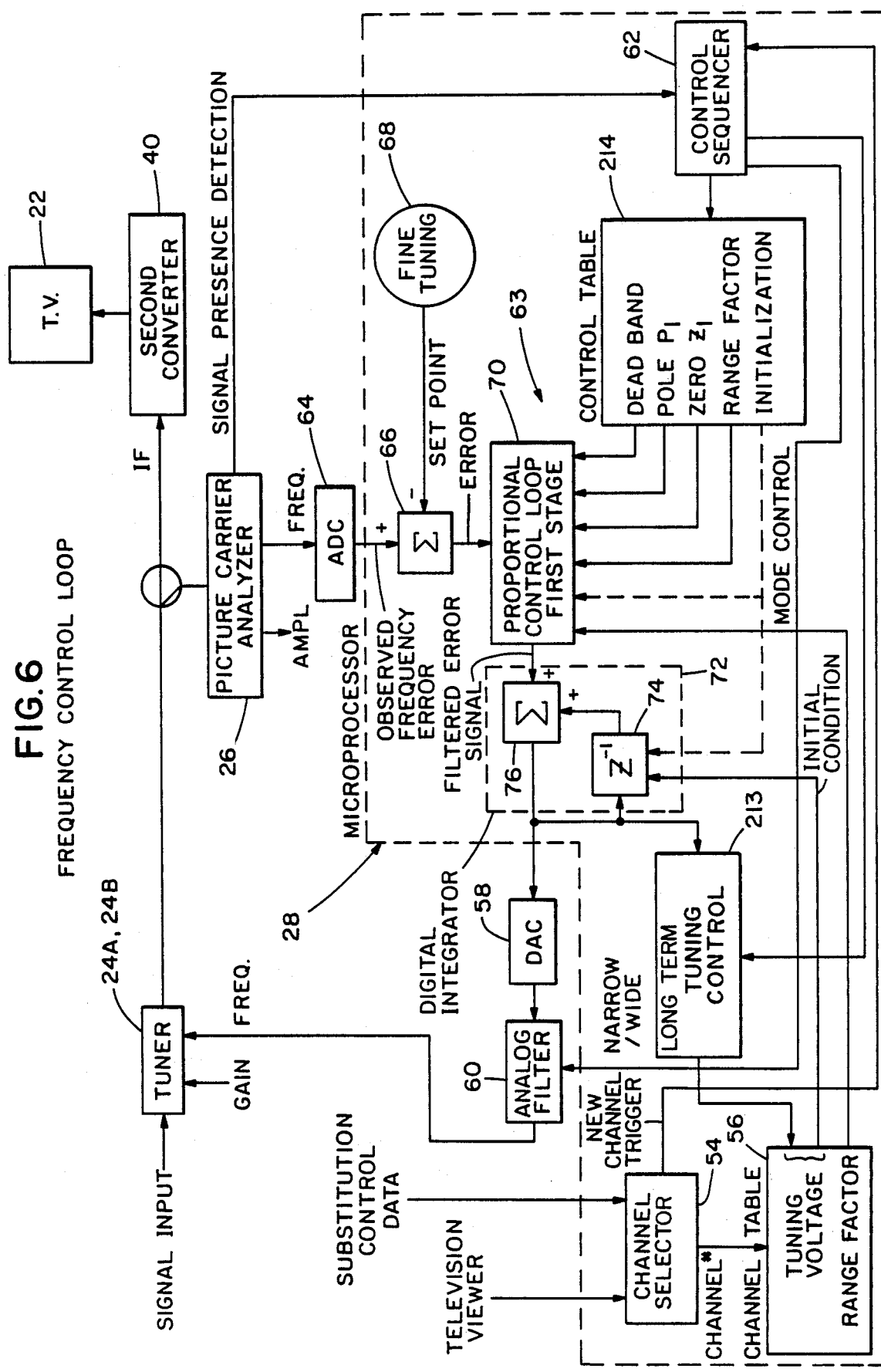

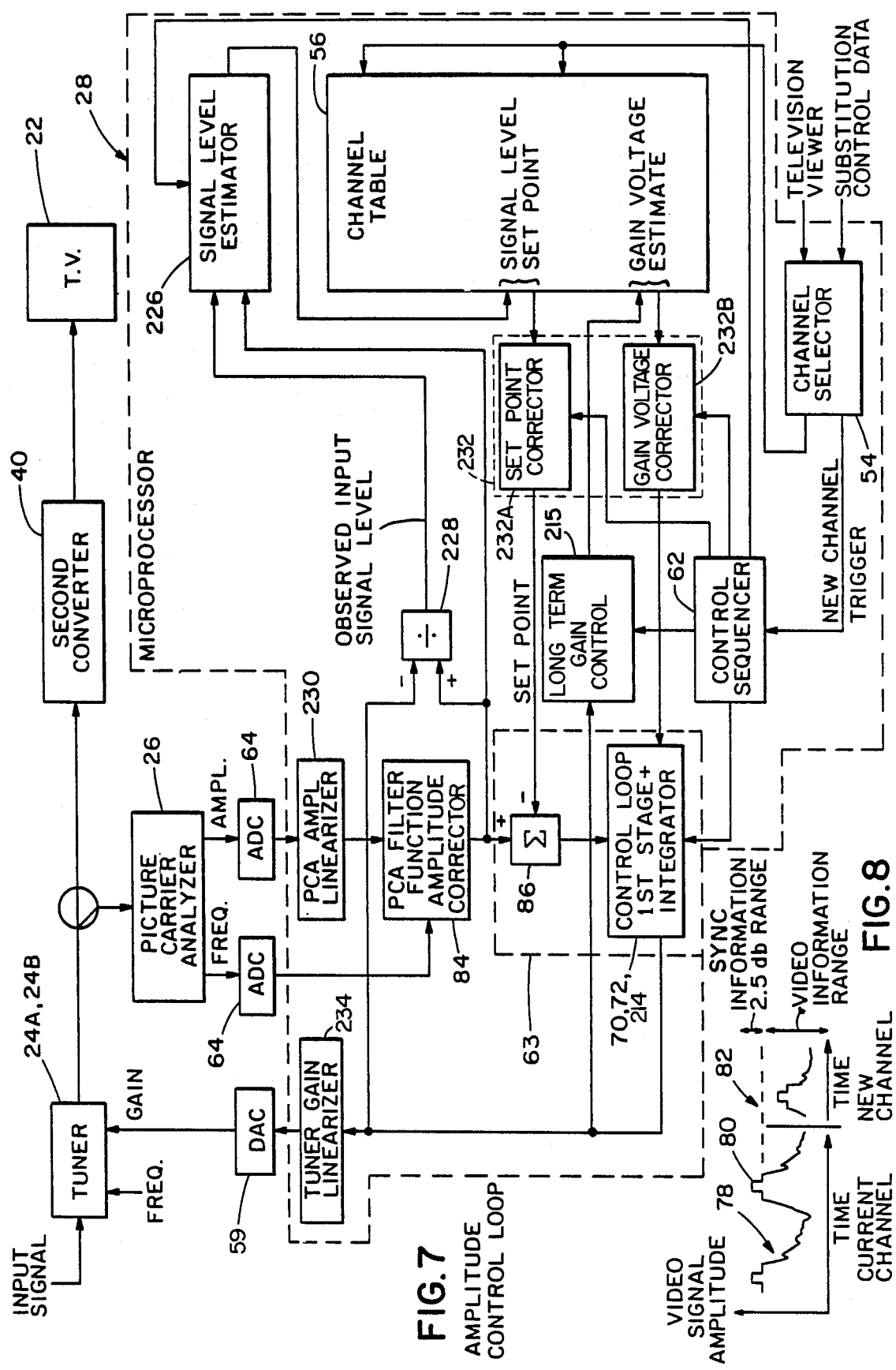

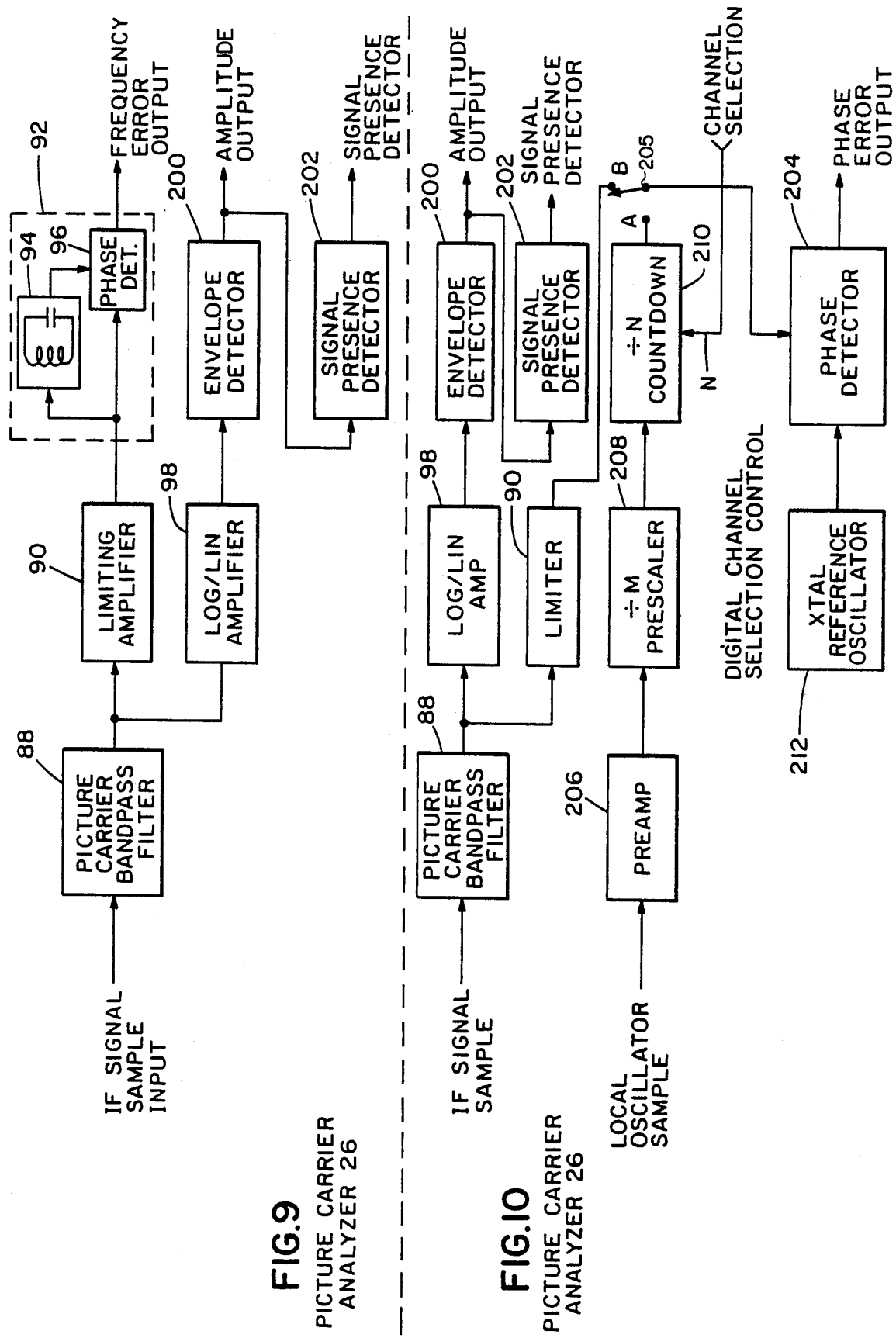
FIG.9 PICTURE CARRIER ANALYZER 26
FIG.10 PICTURE CARRIER ANALYZER 26

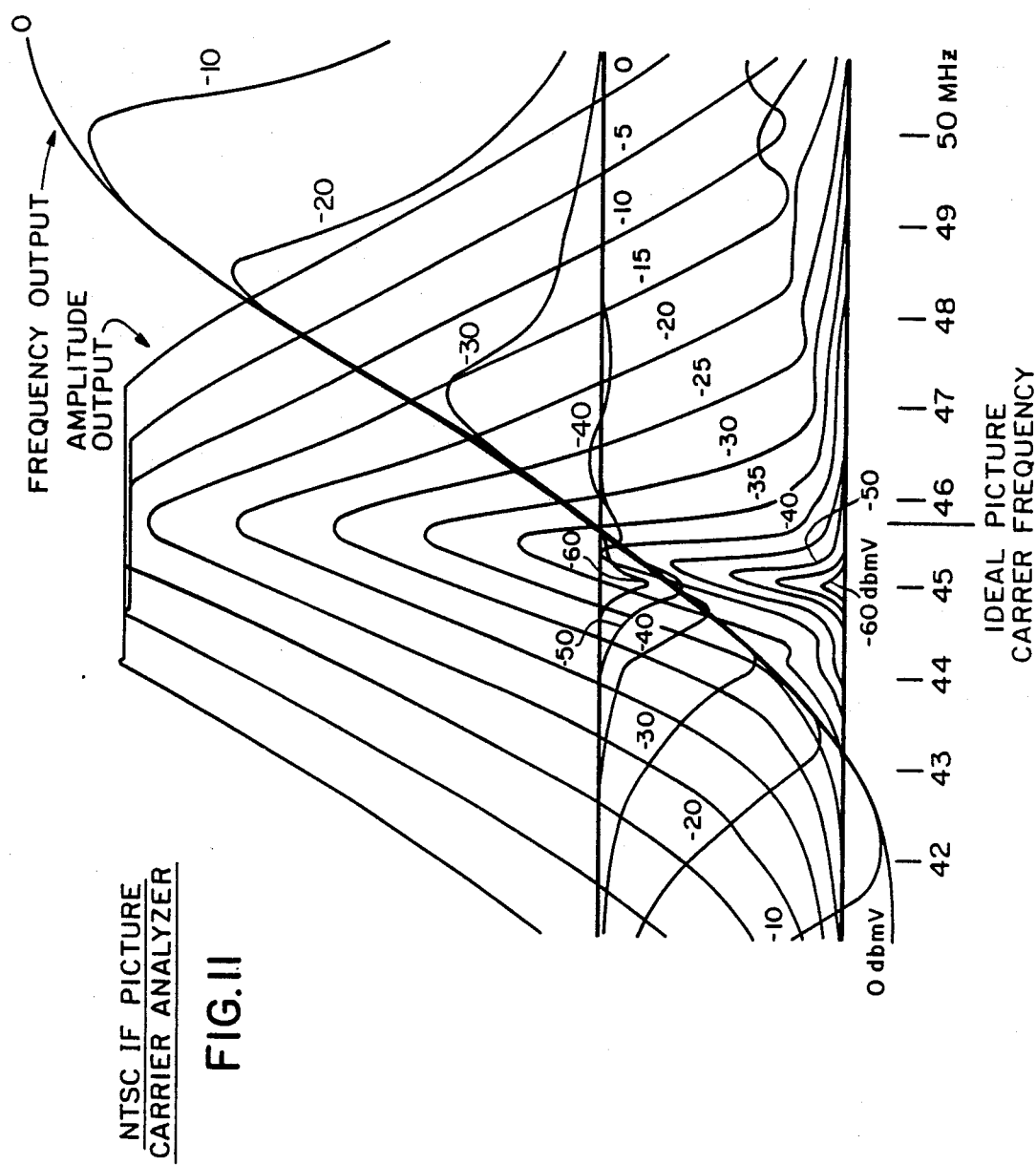

DIGITAL FREQUENCY
CONTROL LOOP/
CHANNEL TABLE INTERFACE

FAST TUNING CONTROL FOR A TELEVISION SYSTEM

This application is a continuation of application Ser. No. 870,223 filed June 3, 1986, now abandoned.

The present invention relates to television systems and more particularly to fast tuning subsystems for switching channels in a television system. Still more particularly it relates to such subsystems in which a selected substitute television signal in a substitute channel can be substituted indistinguishably for one or more normal television signal in respective normal channels, as for market research purposes.

BACKGROUND OF THE INVENTION

Marketing research techniques have been developed in which a substitute television signal in a substitute channel, containing a commercial the effectiveness of which is to be assessed, is substituted for a normal television signal in a normal channel in homes of selected test viewers so that the effectiveness of the commercial can be evaluated. This allows the promoter of a service or product to assess the reaction of a small, demographically controlled panel of test viewers before the wide airing of a commercial which may prove ineffective.

One example of such a television signal substitution system is disclosed in U.S. Pat. No. 4,404,589. As there disclosed, substitute television program signals are transmitted in at least one substitute channel along with signal substitution control signals. A control box or terminal at each test viewer receiver responds to the signal substitution control signals by selectively switching to a substitute television program from a normal program. The signal substitution control signals include a number of different terminal command signals and a number of different event command signals. Each of the terminal command signals includes a respective test viewer address signal for identifying a respective test viewer receiver and a number of event identification signals identifying respective signal substitution events in which this terminal is to participate. Each of the event command signals includes a respective event address signal corresponding to a respective event, an appropriate substitution control command, a substitute channel identification signal, and one or more normal channel identification signals for identifying the normal channels from which the receiver is to be switched. The current event command signals corresponding to each allowable event address are stored in the terminal for later correlation with the terminal's participation event list and to the viewer's selected channel signal. When the viewer selected channel corresponds to a normal channel identification signal associated with a current event command whose event address signal corresponds to an event in which the respective terminal is to participate, the substitute channel is substituted for the channel selected by the viewer for a period determined by the event command signals. Subsequent responses to the events, such as purchases of the respective viewers, are then individually tabulated and analyzed against the responses of viewers receiving the normal signals.

When a viewer changes channels on a modern television receiver, the channel change is carried out in, for example, about a quarter of a second. The change is accompanied by momentary disruption of the picture and a sound pop or a period of sound muting. When a market research company causes a channel substitution, it is desirable that the substitution be carried out so quickly and unobtrusively as to be imperceptible to the normal test viewer. If the substitution were distinguishable, it could, at least subconsciously, influence the response of the test viewer to the commercial. That is, were the viewer to know or suspect he was receiving a test commercial, he might react in a manner in which he believes he is expected to react, rather than acting normally, skewing the test results from his normal response. Therefore, it is desirable that the tuning be accomplished extremely rapidly so as to be indistinguishable. More specifically, the transition time between channels should be kept within about 60 microseconds to prevent an audible pop due to loss of the television signal intercarrier frequency modulated with the sound subcarrier. The normal and substitute channel tuning should be very accurately matched to ensure no shift in picture quality, particularly that of the chroma signal. The transition should be timed to occur during the vertical blanking interval between picture fields so that the change is not seen by the viewer.

Switching channels may require a large frequency change in the tuner. For example, if the normal channel is a low VHF channel (wherein Channel 2 has a picture carrier frequency of 55.25 MHz) and the substitute channel is a high UHF channel (wherein Channel 70 has a video carrier frequency of 807.25 MHz), the tuner might have to slew through more than 700 MHz. The vertical blanking interval of standard NTSC video, during which the substitution is to be effected, takes 1.3 milliseconds. The factor that is most critical in making the substitution indistinguishable is the sound. The audio stage of the television receiver is not tuned to the sound carrier, but is tuned to the 4.5 MHz intercarrier beat frequency generated between the video carrier and the sound carrier in each VHF and UHF channel. When the tuner of the receiver tunes between channels the intercarrier beat frequency disappears because both the video and sound carriers are no longer simultaneously present in the IF pass band. When the audio stage of the television receiver has no signal applied, its internal limiter amplifier will amplify noise up to an audible amplitude level. This causes the pop heard during viewer controlled channel changing. This presents no problem when the viewer changes channels, for it is to be expected. However, if an audible pop were produced during signal substitution, it would alert the viewer to the fact of substitution.

In order to avoid the effect of noise during signal substitution, the channel change must be sufficiently fast that the human ear cannot distinguish it. The total energy of the noise burst is the integral of power over time, but the human ear is essentially logarithmic in perception and can hear extremely low energy noise pulses. To make the noise attendant a channel change unobtrusive, the change should be accomplished in less than about 60 microseconds. Not only is extremely fast tuning required, but also the tuning must be relatively accurate to recover the 4.5 MHz intercarrier beat frequency. Due to the close proximity of the sound carrier of an adjacent channel to the video carrier of a substitute channel, a maximum error of about +500 KHz is required for both the picture and sound subcarriers of the substitute channel to be within the pass band.

Previous signal substitution systems have employed a cable television distribution system with a control box for channel switching located at each test viewer's home. These systems have employed a fast electronic tuner having a voltage controlled oscillator whose output frequency determined the channel to which the tuner was tuned. A voltage divider network established predicted tuning voltages necessary to cause the local oscillator to translate each individual channel's frequency to that of at least one channel of the television receiver. The tuner was made to select a particular channel very quickly by jamming the appropriate control voltage into the local oscillator, causing it to slew rapidly to the new frequency. This is known as jam tuning. Thus, by directing an electronic switch in the local oscillator control circuit to change from a normal channel voltage to the substitute channel voltage, a rapid substitution could be made. This prior art tuner controller system was predictive in nature in that the channel tuning control voltages corresponding to the desired input channels were determined by testing prior to or during installation of the control box at the home of the test viewer. A problem encountered was that with time the correct tuning voltages tended to drift.

Drifting resulted in frequency errors which caused loss of picture definition, and color hue and saturation changes. The automatic fine tuning circuitry in the television set of the test viewer might correct the error, but it would correct the error in a visible manner due to its slow operating speed. With time, the drifting became so extreme as to require that the control boxes be removed from test viewer homes for recalibration.

To extend the useful life of the control boxes without returning them to the shop for recalibration, a station-keeping feedback loop was added to the jam slewing. The electronic tuner assemblies for cable television signal substitution systems then employed a phase-locked loop feedback system which sampled the frequency output of the local oscillator in the tuner to determine if a frequency error were present. If such an error were present, the phase detector would provide an error signal for combination with the predicted voltage signal and application of a resultant voltage signal to the local oscillator of the tuner, thereby causing the tuner to provide the desired frequency output even after drifts such as caused by the aging of components. However, with time, due to aging of the components, the control values predicted for the various frequencies became more and more erroneous. This resulted in the voltage applied during the feed forward phase becoming so incorrect for the particular channel desired that the relatively slow operating phase-locked loop operated such that the viewer could perceive the substitution. Indeed, the initial voltage applied could become so erroneous as not to be able to tune to the proper channel. When the tuning became so impaired, the control box had to be returned to the shop for recalibration. Further, this type of control did not compensate for frequency errors in the received signals. Such errors are caused by transmission or conversion errors in the system ahead of the receiver.

Amplitude variation between the normal channel and the substitute channel also can make unobtrusive channel substitution difficult. The viewer can discern the substitution by a change in the visual quality of the picture. If the signal level changes too much, the television may fail to detect the synchronizing pulses and hence may fail to identify a video signal. The prior systems have taken no account of those problems.

BRIEF SUMMARY OF THE INVENTION

According to one aspect, the present invention improves upon the prior tuning controls in signal substitution by providing adaptive tuning whereby signals representing the predictive tuning voltages are updated automatically when respective channels are tuned in so that the next time channels are changed the jam tuning comes closer to the mark. This assures that component aging never leaves the tuning subsystem in a state where it cannot slew rapidly to within a close proximity of the selected channel with unobtrusive final tuning to the desired frequency.

In another aspect, the present invention provides a relatively fast correction mode in addition to a slow station-keeping mode. This reduces the need for such accurate jam tuning, for it provides for rapid tuning to a suitable accuracy. The jam tuning need only be accurate enough to permit acquisition of the proper channel and prevent the loss of the intercarrier beat frequency.

In still another aspect, the present invention provides for control of the amplitude of the signal. This assures proper recognition of the horizontal synchronizing pulses in the video signal as used in tuning.

The present invention relates particularly to a fast tuning subsystem for use in switching from a current channel to a selected channel of a television system. The term switching is used in the broad sense of changing channels, including slewing between channels. The tuning subsystem includes a tuner for selecting a channel to be received, with a voltage controlled oscillator having a control input for determining, in response to an applied control voltage, the channel frequency the tuner selectively receives. Predictive means supplies a selected predicted voltage signal to the control input of the oscillator, the predictive means including associated memory means in which is stored signals corresponding to respective voltage signals predicted for applying to the oscillator to tune the tuner to receive the channel frequencies of the respective channels, and further including means interconnected between the memory means and the control input of the oscillator for applying a selected one of the respective predicted voltage signals as the selected predicted voltage signal to the control input of the oscillator, the oscillator being responsive to the selected predicted voltage signal to slew the channel frequency at a rapid slew rate to the frequency corresponding to the selected predicted voltage signal. Error detecting means generates a tuning error signal indicative of the tuning error of the tuner off the frequency for the selected channel. Feedback means combines the tuning error signal with the selected predicted voltage signal to provide a control signal at the control input for adjusting the channel frequency to reduce the tuning error.

It is an important aspect of the present invention to provide means responsive to the tuning error signal for automatically and from time to time changing the signals stored in the memory means for respective channels to signals corresponding to the control signals applied to the control input after long term operation of the feedback means upon receipt of frequencies of the respective channels.

In another aspect of the invention, the signals are stored in digital form and the means interconnected between the memory means and the control input comprises a precision digital to analog converter.

In another aspect of the invention, the tuner includes gain control means having a gain control input, the gain control means being responsive to an applied gain control signal for controlling the signal level of the output of the tuner. The predictive means includes means for supplying a selected predicted gain control signal to the gain control input. The associated memory means stores signals corresponding to respective gain control signals predicted for respective channels for providing a predetermined signal level. The predictive means includes means interconnected between the memory means and the gain control input for applying a respective predicted gain control signal to the gain control input corresponding to the selected channel. The error detecting means includes means for generating an amplitude error signal indicative of the amplitude error of the signal level output relative to a set point. The feedback means includes means for combining the amplitude error signal with said selected predicted gain control signals to adjust the signal level output to reduce the amplitude error. The subsystem further includes means for automatically and from time to time changing the signals stored in the memory means for respective channels to signals corresponding to gain control signals applied to the gain control means after long term operation of the feedback means.

In another aspect, the input signal levels of the tuner for respective channels are determined and the set point is adjusted in response thereto.

It is another aspect of the invention to provide means for automatically and from time to time storing in the memory means updated signals corresponding to the control signals applied to the control input for respective channels after settling of the feedback means, the updated signals being stored as signals corresponding to respective voltage signals in lieu of the corresponding prior stored signals.

In another aspect of the invention, the stored signals corresponding to respective voltage signals predicted for applying to the oscillator are of accuracy sufficient to permit acquisition of a selected channel by the tuner. The feedback means has a correction mode and a station-keeping mode. The correction mode provides correction of any error in tuning of an acquired channel fast enough that the correction is substantially imperceptible to the eye and any residual error is substantially imperceptible to the eye. The station-keeping mode operates slowly enough to filter out noise and spurious signals and maintain any residual error below a predetermined limit over long periods of time. The mode of the feedback means is controlled by control means to enter the correction mode upon or shortly after application of the one of the predicted voltage signals and later to enter the station-keeping mode.

In another aspect, the means for controlling the mode operates to place the feedback means in the station-keeping mode a predetermined time after application of the one of the predicted voltage signals.

In still another aspect, the means for controlling the mode operates to place the feedback means in the station-keeping mode upon the error being below a predetermined limit in the corrective mode.

Another aspect includes providing means for storing in the memory means updated signals corresponding to the control signals applied to the control input for respective channels after the settling of the feedback means in the station-keeping mode, such updated signals being stored as signals corresponding to respective voltage signals in lieu of the corresponding prior stored signals.

Another aspect includes providing means for controlling the response time of the feedback means to provide a relatively fast response time for a period of time after application of the one of the respective predicted voltage signals to the control input and thereafter a relatively slow response time, the period being sufficiently long that transients in the slew mode of the predictive means do not perturb the long term feedback mode of the feedback means substantially.

Another aspect of the invention provides means for disabling the feedback means for a predetermined period of time after application of the one of the respective predetected voltage signals to the control input, the predetermined period being sufficiently long that the detected transients in the slew mode of the predictive means do not perturb the long term feedback mode of the feedback means substantially.

Various other advantages, objects and aspects of the invention will become apparent from the following detailed description, particularly when taken in connection with the accompanying drawings.

BRIEF DESCRIPTION OF THE DRAWINGS

FIG. 6 is a more detailed block diagram of the frequency control loop for the fast tuning subsystems shown in FIGS. 1, 3, 4 and 5;

FIG. 7 is a more detailed block diagram of the amplitude control loop for the fast tuning subsystem shown in FIGS. 1, 3, 4, and 5;

FIG. 8 shows the video signals in respective channels where amplitude mismatch creates a sync separation problem solved by the present invention;

FIG. 9 is a block diagram of one embodiment of the picture carrier analyzer used in the control loops of FIGS. 6 and 7;

FIG. 10 is a block diagram of an alternative embodiment of the picture carrier analyzer used in the control loops of FIGS. 6 and 7;

FIG. 11 comprises sets of curves illustrating the dynamic response of the picture carrier analyzers shown in FIGS. 9 and 10;

Corresponding reference characters indicate corresponding components throughout the several figures.

DETAILED DESCRIPTION OF THE PREFERRED EMBODIMENTS

Figure 1:
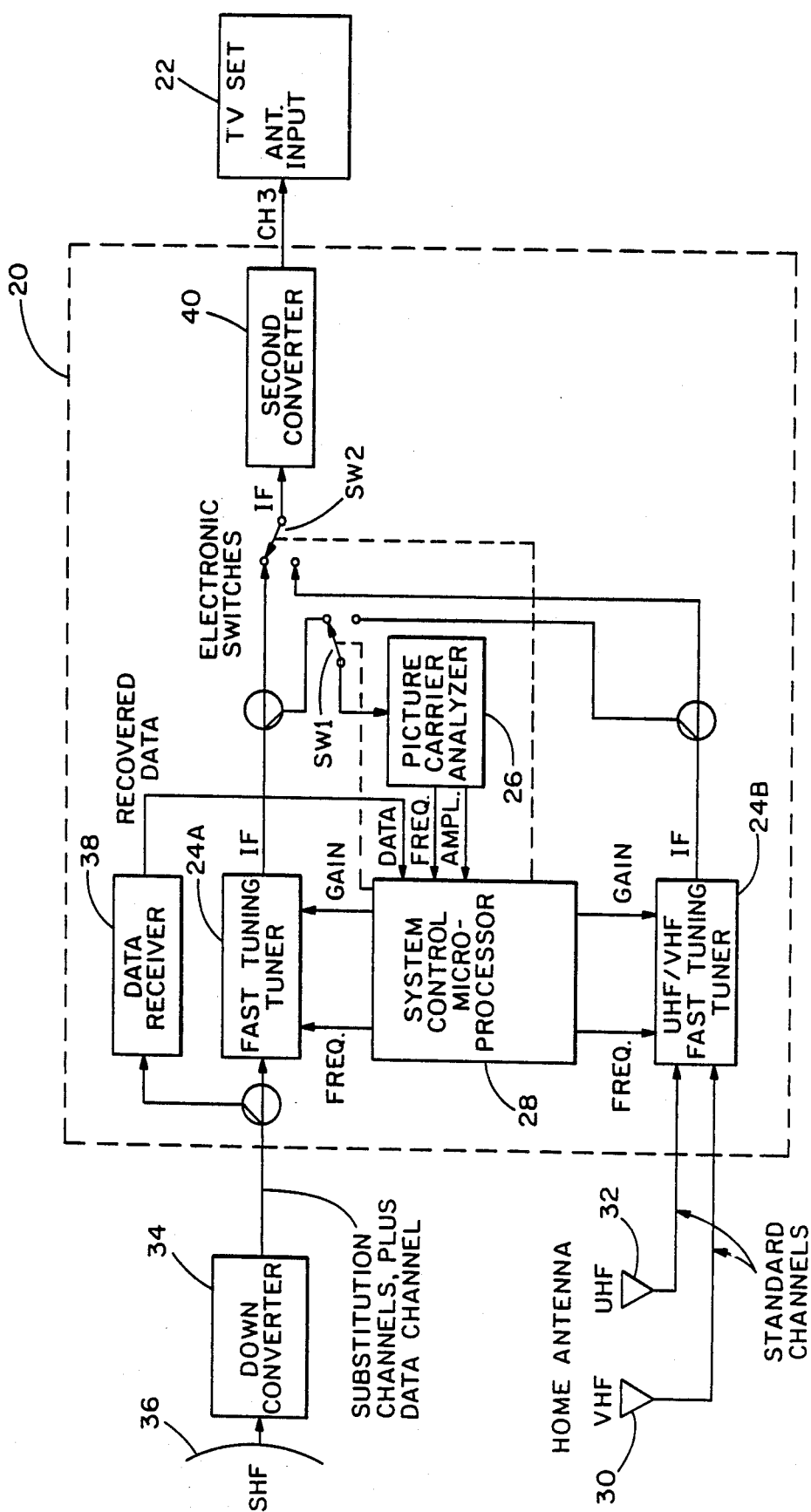
FIG. 1 is a block diagram of a fast tuning subsystem for the fast tuning of a television receiver for signal substitution according to the present invention utilizing two fast tuning tuners for respective normal and substitution channels.

As shown in FIG. 1, a control box 20 is used in a television system for switching between substitute channels and normal channels. The control box 20 is located, for example, at the home of each test viewer and provides a signal input on one of the channels selectable by the television receiver 22 of the test viewer. Each box 20 is under the control of a remote supervisory control facility (not shown) which selects, for example, commercials in a substitute channel for insertion into a selected normal channel for the purpose of testing the effectiveness of each commercial using an appropriately selected panel of viewers. An example of a television system with multi-event signal substitution is shown and discussed in the above-mentioned U.S. Pat. No. 4,404,589.

As mentioned above, it is desirable that a test viewer not know when a substitute commercial is inserted in place of a commercial of a normal television channel. The judgment of the test viewer could be influenced, if only subconsciously, if the substitution were visually or aurally distinguishable. One aspect of the present invention is the ability to switch between channels so swiftly that the act of signal substitution is indistinguishable by the test viewer.

Figure 2:
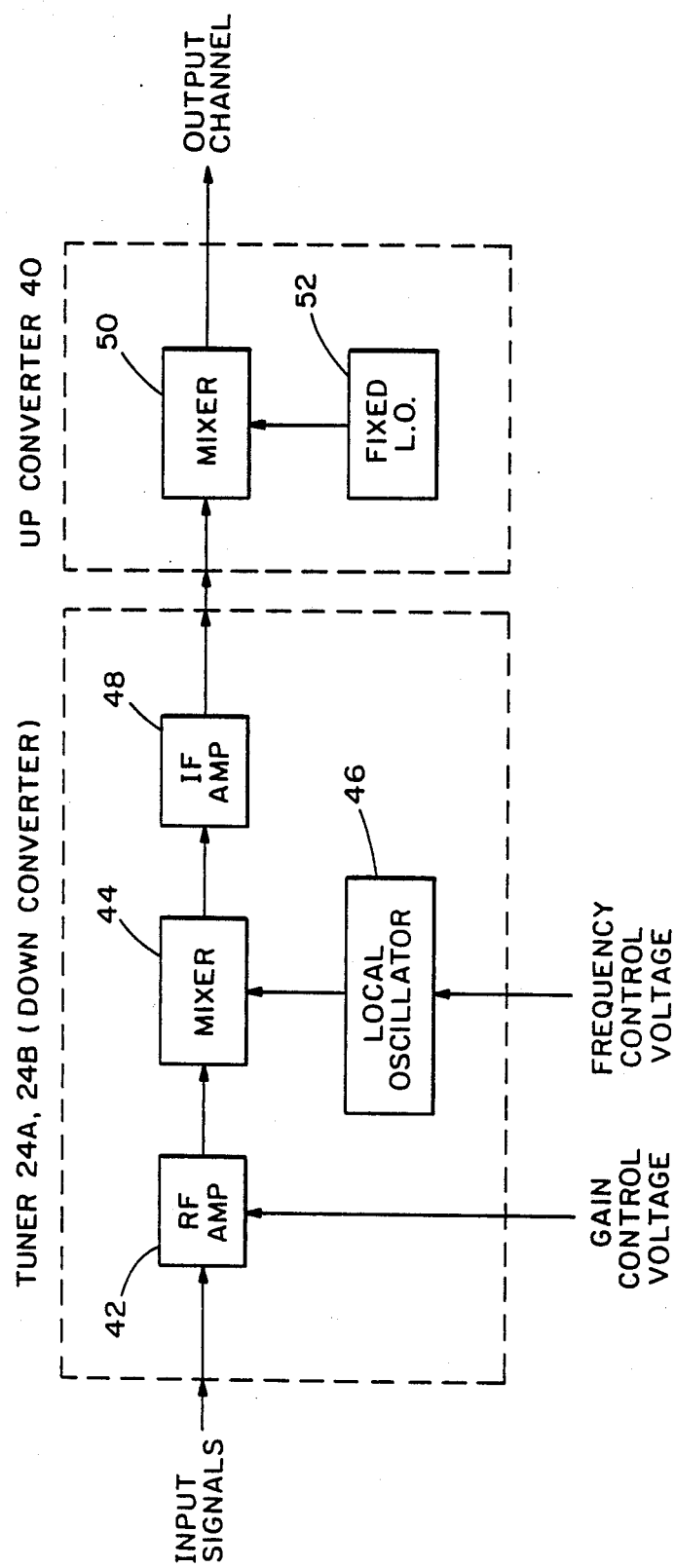
FIG. 2 is a block diagram of the fast tuning tuner and up converter comprising the frequency converters of the subsystem shown in FIG. 1.

The control box 20 includes one or more fast tuning tuners 24A, 24B so that channel substitution is accomplished so quickly as to be indistinguishable to an average viewer. As shown, a tuner 24A is provided for the substitute channels and a tuner 24B for the normal channels. Major components of the tuners 24A, 24B are shown in FIG. 2.

Each tuner 24A, 24B receives input signals from either an antenna 30 or 32 directly or a down converter 34. These input signals are in respective channels at respective different video carrier frequencies. The input signals are preconditioned by an input gain control 42, shown as a gain controlled radio frequency (RF) amplifier 42, the gain of which, either up or down, is controlled as a function of the level of a dc gain control voltage input. The purpose of the gain control 42 is to control signal level. This permits attenuating local signals to prevent distortion of these strong signals in subsequent stages. The gain controlled amplifier 42 is also useful in signal matching of the amplitude characteristics of the substitute channels to provide unobtrusive substitution, as will be discussed more fully below. The output of the radio frequency amplifier 42 is applied to a mixer 44 which also receives the output of a voltage controlled local oscillator 46 for the purpose of providing the conventional intermediate frequency (IF) output.

The mixer 44 operates on the hetrodyne principle where the unmodulated, continuous-wave signal generated by the local oscillator 46 beats with the received station signals to produce signals at intermediate frequencies. The output of the mixer 44 is then amplified by an intermediate frequency amplifier 48. The IF amplifier 48 further includes a channel selection filter which passes only a channel having a predetermined fixed intermediate frequency. The local oscillator 46 is a voltage controlled oscillator having a voltage control signal applied to its control input for controlling the oscillation frequency output thereby, hence selecting the input channel converted to the fixed intermediate frequency. The intermediate frequency output of the amplifier 48 is then converted by a second converter 40 to the frequency of a channel, for example, channel 3, to be supplied as an input to the television receiver 22. The channel to be supplied is a channel normally unused in the viewing area. The second converter 40 comprises a mixer 50 and a fixed frequency local oscillator 52 operating in similar fashion to the mixer 44 and local oscillator 46, respectively.

Referring again to FIG. 1, a picture carrier analyzer (PCA) 26 is switched between the outputs of the two tuners 24A, 24B by an electronic switch SW1, the operation of which is controlled by a system control or microprocessor 28 to sample the outputs of the respective tuners. The picture carrier analyzer 26 provides assessments of the actual frequency and the amplitude of each substitute and normal television channel to the system control 28, which has a memory where the information is stored. Alternative preferred embodiments of picture carrier analyzers 26 are shown in FIGS. 9 and 10, and will be described below.

As shown in FIG. 1, the control box 20 may, with an over-the-air system, receive normal channels via one or more antennas 30, 32 at the receiver 22 over the VHF and/or UHF channels, respectively. These antennas 30, 32 may feed the lower tuner 24B for the selection of the normal channels. If low power UHF channels are not available for commercial testing activities, the substitute channels may be carried over the super high frequency (SHF) band. With the use of the super high frequency band, a down converter 34 is used with an SHF antenna 36 to reduce the frequency of the substitute channel signals as received so that they can be readily transported to the control box 20 for substitution purposes.

The down converter 34 feeds the upper tuner 24A for the selection of the substitute channels. Even though the down converter 34 is normally a crystal controlled device, it is subject to frequency drift due to its high frequency range and the wide range of temperatures it may experience when located with the antenna 36, which may be outside a test viewer's home. The control system of the present invention compensates for this drift, as will be described below.

The control box 20 includes a data receiver 38 which separates control data signals generated at the testing facility by the supervisory control from the substitute channel signals transmitted over the substitute channels and feeds the data to the system control 28 for controlling various functions, such as channel switching operations. The tuners 24A, 24B provide respective signals at the common intermediate frequency (IF) input to terminals of an electronic switch SW2, the operation of which is also controlled by the system control 28 to select the output of one or the other of the tuners 24A, 24B to provide the input to the second converter 40 which converts the intermediate frequency signals to a channel frequency to which the test viewer's television receiver 22 is tuned. There are typically at least two substitute channels, and the tuner 24A functions to select a channel among the appropriate substitute channels. The tuner 24B may be required to select a channel among normal channels, depending upon the channel selection made by the test viewer. The electronic switch SW2 operates very fast and is controlled to switch during the vertical blanking interval of the television receiver 22 so as not to alert the viewer to the fact of substitution.

The system control 28 under the control of the data from the data receiver 38 comprises a frequency control and an amplitude control. The system control selects a channel, and hence tuner 24A or 24B, in response to the control data and controls the tuner frequency and gain to null any error between a selected frequency and amplitude and the actual frequency and amplitude as input from the picture carrier analyzer 26.

Figure 3:
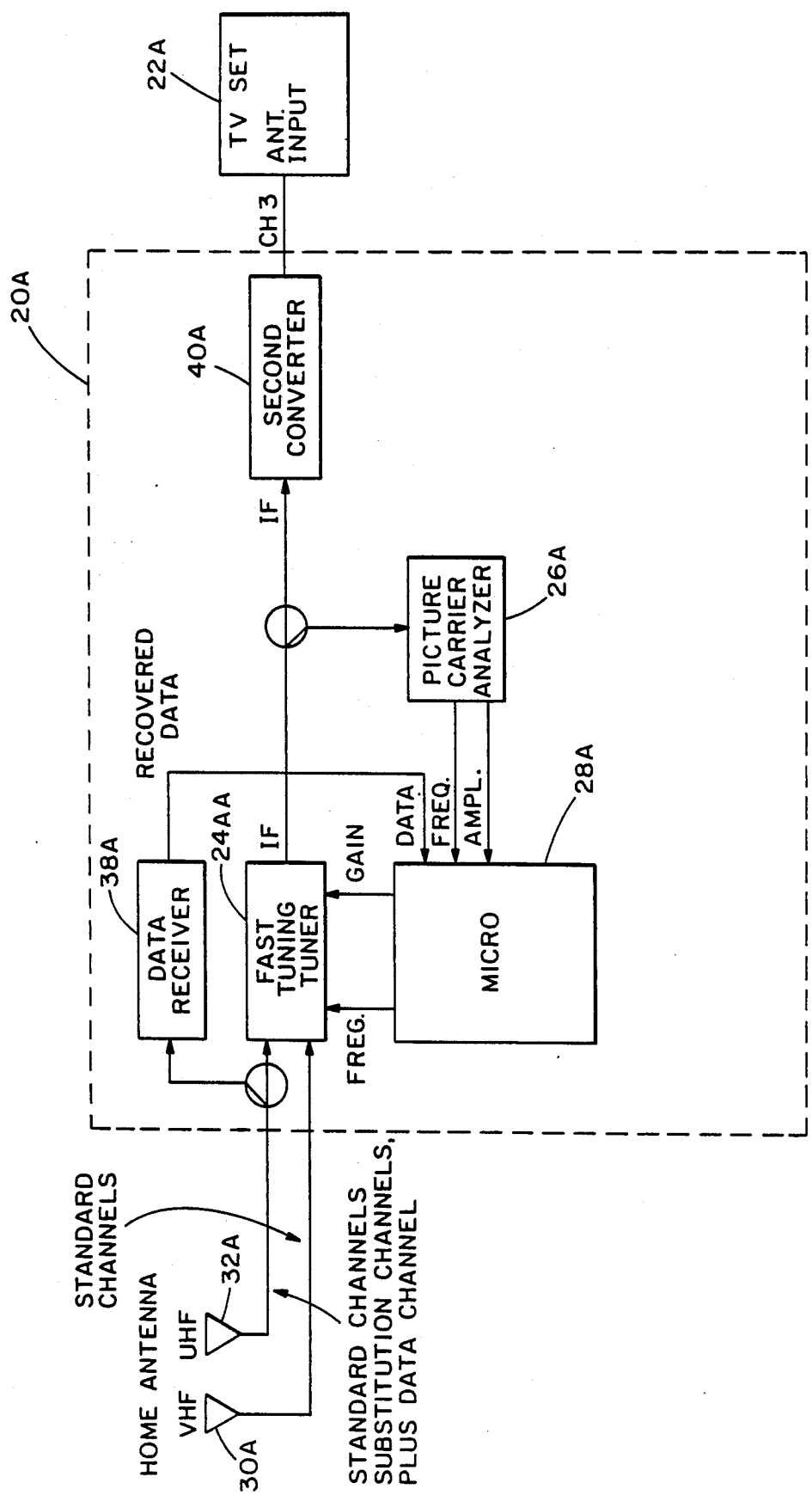
FIG. 3 is a block diagram of a fast tuning subsystem similar to that of FIG. 1 wherein a single fast tuning tuner is used when substitute and normal channels are received on the same antenna.

FIG. 3 shows an alternative preferred embodiment of a control box 20A of the present invention wherein low power UHF channels are available to the commercial testing facility for use as the substitution channels. Components of the control box 20A corresponding to components of the control box 20 are designated by the reference numeral assigned to the component of the control box 20 with the addition of the suffix "A". The structure and operation of the control box 20A are similar to those of the control box 20 except, as the substitution channels are low power UHF channels rather than channels in the SHF band, no down converter 34 is required. A single fast tuning tuner 24AA may be used for tuning all of the normal channels and substitution channels. Electronic switches SW1 and SW2 used in the control box 20 are thus not required in the control box 20A.

Figure 4:
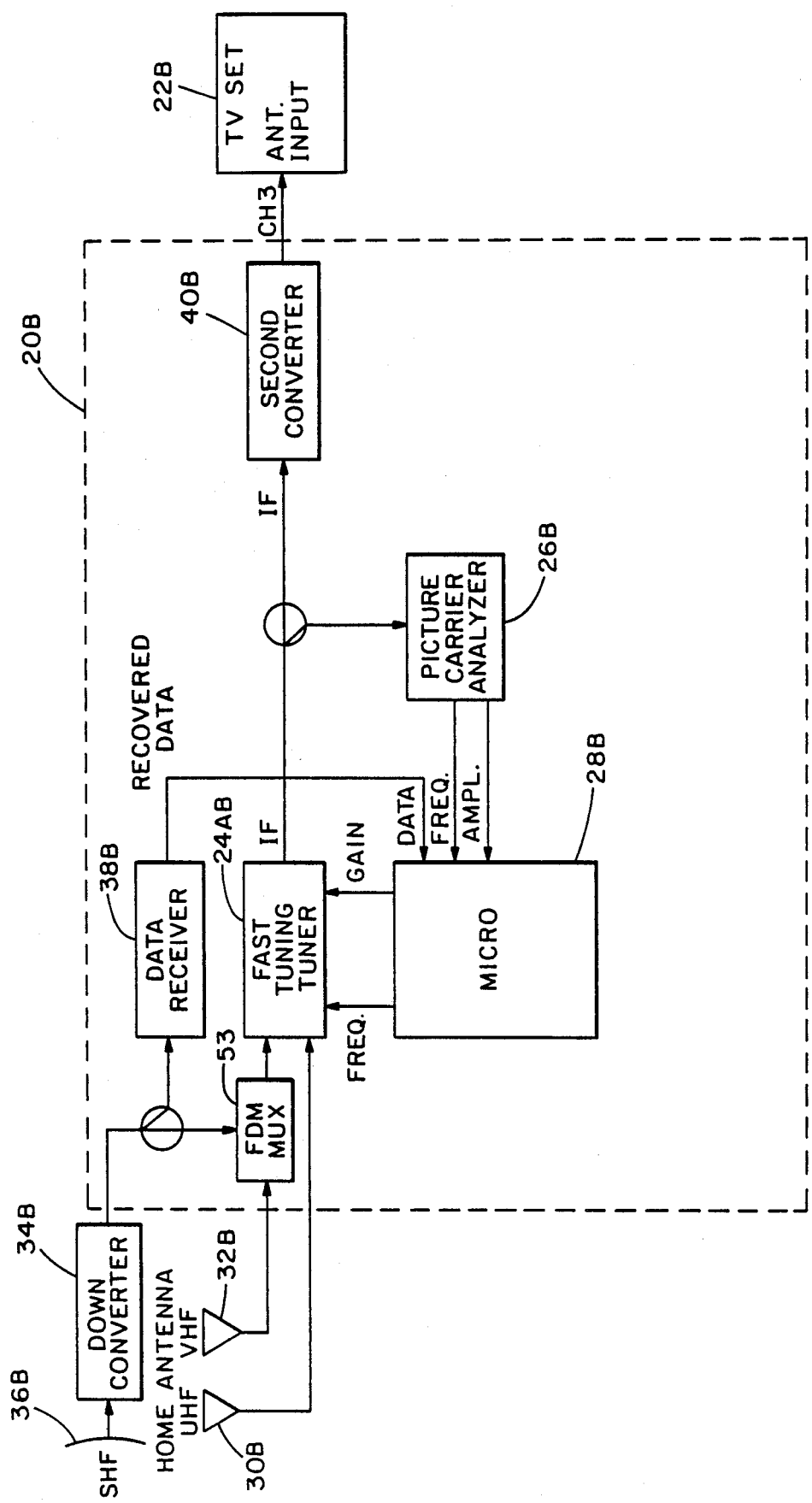
FIG. 4 is a block diagram of a fast tuning subsystem similar to that of FIG. 3 wherein a single fast tuning tuner is used when substitute and normal channels are received in different frequency bands.

Another alternative embodiment of the control box of the present invention is indicated by reference character 20B in FIG. 4. Components of the control box 20B corresponding to the control box 20 are designated by the reference numeral assigned to components of the component of the control box 20 with the addition of the suffix "B". The structure and operation of the control box 20B are similar to those of the control box 20 except that the down converter 34B reduces the frequencies of the substitute channels on the SHF band to frequencies between channels 6 and 7 in the VHF band (between 88 MHz and 174 MHz). The substitute channels are thus effectively converted to VHF channels. The output of the down converter 34B is combined with the signals received by the VHF antenna 30B by means of a frequency domain multiplexer 53. The output of the multiplexer 53 (representing the substitute VHF channels and the normal VHF channels) is fed along with the feed from the UHF antenna 32B to the single fast tuning tuner 24AB of the control box 20B. Again the need for electronic switches SW1 and SW2 is eliminated in the control box 20B.

Figure 5:
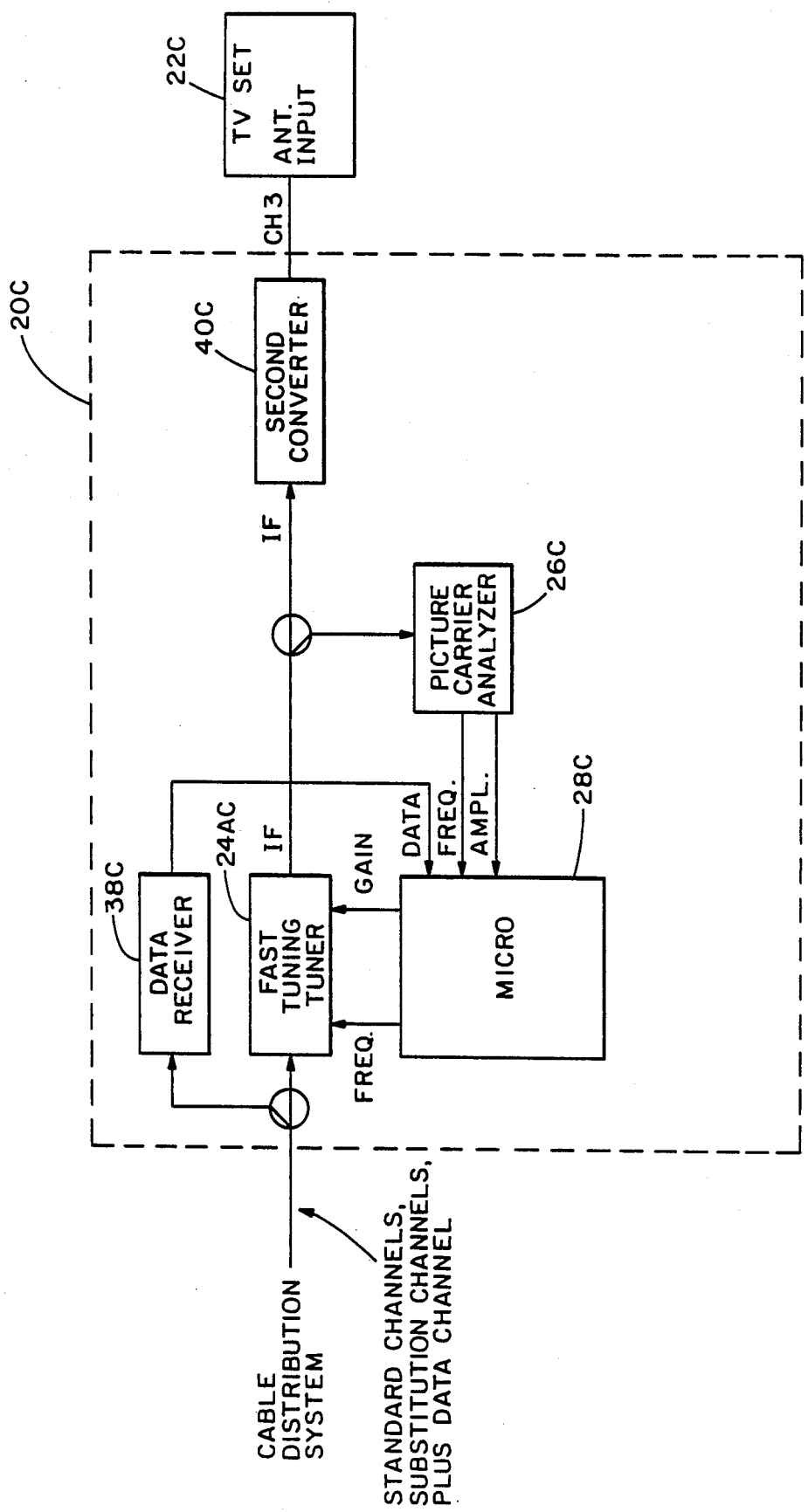
FIG. 5 is a block diagram of a fast tuning subsystem similar to that of FIG. 3 wherein a single fast tuning tuner is used when substitute and normal channels are received by cable.

Yet another alternative embodiment of the control box of the present invention is indicated by reference character 20C in FIG. 5. Components of the control box 20C corresponding to components of the control box 20 are designated by the reference numeral assigned to the component of the control box 20 with the addition of the suffix "C". The structure and operation of the control box 20C are similar to those of the control box 20 except control box 20C is for use with a cable distribution system carrying the standard channels, the substitution channels and the data channel. With this arrangement, only a single fast tuning tuner 24AC is required, and the need for the electronic switches SW1 and SW2 is again eliminated in the control box 20C.

Operation of the control box 20 with respect to correction of frequency error is best considered with reference to FIG. 6, which discloses a digital implementation of the box 20. The digital implementation includes a system control program which controls actions by the microprocessor 28. This implementation is preferred due to the sophistication of the system; however, an analog implementation could also be used. The tuner 24A, 24B therein identified represents any or all of the tuners shown in the different embodiments of FIGS. 1 to 5. A channel selector 54 for the microprocessor 28 provides a channel select signal indicating the channel selected by either the test viewer or the supervisory facility, the latter being separated from the received signals by the data receiver 38. The initial or characterizing voltage for that particular channel stored in channel table memory 56 is jammed into a digital to analog converter (DAC) 58. (A more detailed explanation of the jamming will be set forth below). The analog output of the DAC 58 is applied through an analog filter 60 which is switchable between a wide bandwidth, fast response mode and a narrow bandwidth, slow response mode. The filter output is input to the control terminal of the local oscillator 46 of the tuner 24A, 24B.

At the time of jamming, the filter 60 is in its fast response mode. In the jam phase, the tuner 24A, 24B is slewed to well within 500 kHz of the proper frequency for the new channel by providing a sufficiently accurate characterizing voltage. The filter 60 remains in the wide band width configuration during the next phase of control, a correction mode. By appropriate selection of constants for the control loop 63, as selected from a control table 214 by a control sequencer 62, this will take a relatively short predetermined interval. The control sequencer 62 thereafter switches the filter 60 to its narrow bandpass configuration for a station-keeping phase of control wherein it filters out the thermal and digital feedthrough noise resulting from operation of the DAC 58.

The picture carrier analyzer 26 (the operation of which is described later with reference to FIG. 9) samples the IF output of the tuner 24A, 24B and provides an actual frequency signal output for operation of the feedback control loop 63. Specifically, the actual signal is applied to an analog to digital converter (ADC) 64. The digital output of the ADC 64 is summed in an error signal generator 66 in the form of a summer 66 with a negative digital set point input from a set point signal source 68. The set point input can be used to implement a fine tuning control function. The error signal output from the summer 66 is applied to a first stage 70 of the control loop 63, the operation of which is discussed below. The filtered output of the first stage 70 is applied to the second stage of the control loop 63, a digital integrator 72 formed by a unit delay $Z^{-1}$ circuit 74 and a summer 76. The integrator 72 adds the error signal from the first stage 70 to the value applied through the $Z^{-1}$ circuit 74. In the second or correction phase of control, which may take about 100 milliseconds, the frequency is brought within about ±100 kHz of the proper frequency. This permits correction of any residual tuning induced color and contrast error, due to frequency errors, to occur so quickly and accurately that it is hardly noticed, if at all, by the viewer.

In the third or station-keeping phase of control, the time constant of the control loop 63 is set for 3–10 seconds to achieve a minimum noise bandwidth and consequent maximum accuracy. During this phase, a dead zone or other limit cycling suppression mechanism is enabled, so that fine corrections in the frequency will not represent a continuing annoyance for the viewer. The purpose of the station-keeping phase of control is to compensate for aging of components and any weather induced drift in the SHF down converter 34, if the latter be used. It maintains any residual error below some predetermined level and at the same time is not responsive to noise and spurious signals that would disturb the tuning, assuring a stable determination of the proper control signal level for proper tuning. During the fourth phase of control known as adaptive estimation, the charaterization voltage of the channel table 56 can be updated based upon corrections made during the station-keeping phase. Thus, the next time a channel is selected, the jam phase will result in high accuracy so that the other control phases are more quickly effective.

Operation of the control box 20 with respect to amplitude control is best considered with reference to FIG. 7. Many of the same elements as shown in FIG. 6 for frequency control are used for amplitude control, but are differently programmed. In general, they operate in a similar manner in both modes and need not be described separately in detail. This applies specifically to the control loop 63 comprising an error signal generator 86 (in lieu of the error signal generator 66), the control loop first stage 70 controlled from the control table 212, and the digital integrator 72. Considerations with respect to amplitude are somewhat different than those regarding frequency because a slight error in frequency causes the television to malfunction noticeably and must be accurate within about one part in 10,000. Amplitude error on the other hand, may require accuracy to only about 2 db to prevent loss of sync detection.

As shown in the FIG. 8 detail of the video signal waveform, the synchronization pulses at the crest of the waves can be detected with a 1 or 2 dB tolerance in composite video amplitude. FIG. 8 shows video signals 78 of a current channel. The video is synchronized by the horizontal sync pulses 80 which rise above the acitve video and are detected by peak detectors in the television receiver 22. If the video signals 82 of a new channel which is switched to are of much less amplitude, and sync pulses will not be detected, and the video will be lost by the receiver 22. For amplitude control, the same sort of control loop 63 is used. However, because the accuracy requirement is less stringent, the station-keeping phase of the control is unnecessary for amplitude control.

In the jam mode, the initial condition from the channel table 56 is jammed into a DAC 59 functioning like the DAC 58 to apply a predicted gain control voltage to the RF amplifier 42 in the tuner 24A, 24B. In the correction mode, the picture carrier analyzer 26 samples the output of the tuner 24A, 24B and provides an actual amplitude output which is converted to a digital value by an analog to digital converter (ADC) 64. This output is adjusted in the filter function amplitude corrector 84 to compensate for PCA filter variations with respect to frequency and then summed by the error signal generator 86 in the form of a summer with a negative set point value (based upon various signal matching criteria as discussed below) and sent to the control loop first stage 70 and digital integrator 72. (The control table 214 for controlling the first stage 70 is not separately shown in FIG. 7 it functions as explained in connection with FIG. 6.) The amplitude error value is also combined with the initial value for purposes of updating the channel table 56. During the correction phase, the control loop 63 adjusts the input of the DAC 58 based upon the actual amplitude determination of the picture carrier analyzer 26 to bring the amplitude output of the tuner 24A, 24B closer to the desired level as determined by the set point.

Referring to FIG. 9, a block diagram of major components of a picture carrier analyzer 26 is shown. The IF signal is applied to a narrow bandpass filter 88 which filters out all components but the picture carrier. The separated picture carrier is fed to a limiting amplifier 90 to remove all amplitude information. The limited signal is applied to a frequency discriminator 92 formed of an LC tuned circuit 94 and a phase detector 96. The tuned circuit 94 serves as a frequency reference. As the picture carrier signal goes off the center frequency of the LC tuned circuit 94, the circuit 94 introduces a phase shift, which is detected by the subsequent phase detector 96. The detected phase difference is a measure of the frequency error of the intermediate frequency.

The separated picture carrier signal is also applied to a logarithmic amplifier 98 (or a linear amplifier if lesser accuracy is required). The logarithmic amplifier 98 provides an accurate amplitude representation over a wide range of variations of input level. An envelope detector 200 responds to the output of the amplifier 98 and provides a measure of amplitude of the signal.

A signal presence detector 202 discriminates between legitimate signals and noise or spurious signals and provides a signal presence signal indicating the presence of legitimate video signals. Such detector 202 may be a video sync signal separator which provides a warning should no synchronization pulses be detected in the amplitude output. Alternatively, such detector 202 may comprise a simple amplitude threshold circuit for discriminating by signal level between signal and noise, with some reduction in performance. This signal presence detector 202 can serve as a loop disable to prevent updating of the jam value information in the channel table based upon erroneous information. That is, if the sync detector does not detect the synchronization pulses, the input signal is likely noise as opposed to a picture signal.

A variation of the picture carrier analyzer 26 for use with a cable television alternative is shown in FIG. 10. This alternative itself is shown as including two alternatives, as there is an A path and a B path each leading to a phase detector 204 as selected by a selector switch 205. The A alternative depends upon the reasonable assumptions that the input signal has very high frequency accuracy and that the major source of any frequency error is in the drifting of the local oscillator 46. In this alternative, the output of the local oscillator 46 is sampled and passes through a preamplifier 206, the output frequency of which is divided by M in a prescaler 208. The prescaler output frequency is divided by N in a countdown circuit 210, where N is the integral factor to reduce the frequency down to what should be a standard frequency produced by a crystal reference oscillator 212. The frequencies output by the countdown circuit 210 and the reference oscillator 212 are compared in the phase detector 204. With the B alternative, the IF separated picture carrier phase error is measured, much as was done with respect to the picture carrier analyzer 26 shown in FIG. 9, with the output going through the limiter 90 and then to the phase detector 204 for comparison against the crystal reference oscillator 212. In either case, the amplitude output is the result of a sample of the IF signal which, after filtering by the narrow bandpass filter 88, goes through the logarithmic or optionally linear amplifier 98 where that output is sensed by the envelope detector 200 to provide the amplitude output.

Referring now to FIG. 11, the frequency and amplitude output curves from the picture carrier analyzer 26 are shown for various input levels, ranging from 0 dBmV to −60 dBmV. The amplitude output curves have central peaks while the frequency curves are somewhat "S" shaped. The sharp peaks of the amplitude curves at the 45.75 MHz nominal intermediate carrier frequency are due to the response of input filters in the picture carrier analyzer 26. With respect to the frequency curves, there is a major central nesting or overlapping of curves. The various frequency curves break away from the central nesting due to the finite gain of realizable limiting amplifiers 90. Signals outside that range are to be ignored because they most likely represent signal components of adjacent channels.

Note that any significant error from the nominal frequency induces a reduction in the detected amplitude due to the responses of the picture carrier bandpass filter 88. This error can be removed by the filter function amplitude corrector 84 which includes a frequency error compensation table stored in nonvolatile memory. In this way, amplitude and frequency control functions can be completely separated.

Figure 12:
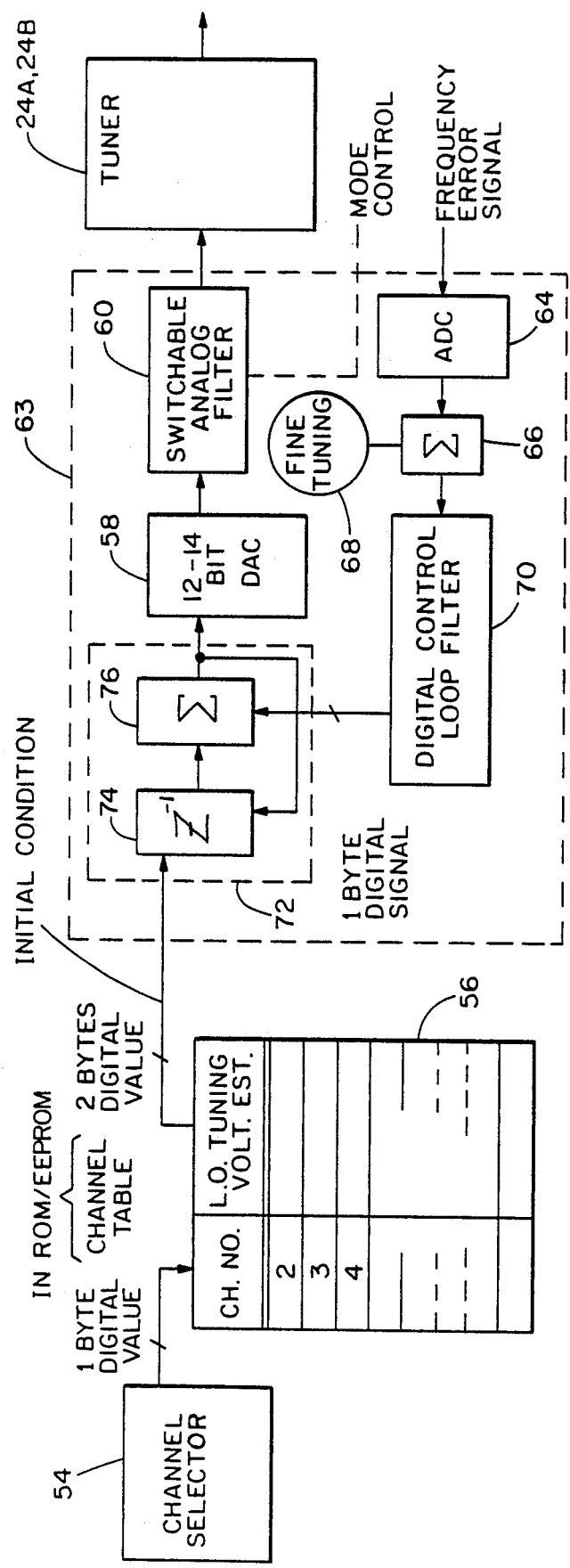
FIG. 12 is a more detailed block diagram of the interface between the channel table and the digital frequency control loop shown in FIG. 6.

FIG. 12 shows in greater detail the interface between the control loop 63 and the channel table 56. The DAC 58 has 12-14 bit accuracy. Great accuracy is needed because this DAC 58 is also in the long term station-keeping control loop, which has a narrow frequency error tolerance. The operation of the control loop 63 is described further below. It suffices to know here that in the jam phase 16 bits of digital information corresponding to the characterization voltage is passed to the DAC 58 from the channel table 56. The DAC 58 converts this to an analog signal for application to the switchable analog filter 60. The switchable filter 60 is controlled by a mode control signal from control sequencer 62 of the microprocessor 28 (FIG. 6) to be in its wide band configuration during the jam phase of operation of the control box 20 to apply the tuning voltage quickly to the control input of the local oscillator 46 in the tuner 24A, 24B. As previously described, the frequency error signal from the picture carrier analyzer 26 is converted to a digital value by the analog to digital converter 64. This digital value is combined by the summer 66 with the set point by the summer 66 from the set point signal source 68 and applied to the first stage 70. The speed of response of the control loop 63 for each respective mode of control operation is determined by the control table 214. The output of the first stage 70 is a one byte digital signal which is summed in the summer 76 with the initial 16-bit characterization value by operation of the unit delay $Z^{-1}$ circuit 74 and is converted by the DAC 58 to an analog value and applied to the switchable filter 60. The unit delay $Z^{-1}$ circuit 74 and the summer 76 form the integrator 72, whereby repetitive applications of the 8 bit error signal produces a full 16-bit DAC input signal. During the jam mode, the switchable analog filter 60 is set for wide bandwidth to facilitate immediate slew to the new channel's tuning voltage and rapid correction of any residual error. Following the corrective mode, the filter is switched to its narrow band configuration to filter out the thermal and digital feed through noise generated by the highly accurate DAC 58.

CHARACTERIZATION

The signals stored in the channel table 56 corresponding to respective predicted control voltage for the local oscillator 46 are initially stored in the channel table in the course of manufacture. The microprocessor 28 includes means for adaptive predictions. This provides a fourth phase or adaptive prediction mode which functions to update the information in the channel table 56 each time a channel is tuned, based upon the current observed tuning voltage at the control input of the local oscillator 46. This eliminates the effects of long term aging of components or environmental differences between the current environment and the factory characterization environment. This also reduces the demands for initial accuracy in the stored predictive signals. Another advantage of such updating is that the next channel is selected for switching to, the initial or jam phase of the control box 20 will have a high accuracy providing a more rapid settling of the control loop 63. The high speed second phase, or corrective control phase, is sufficiently wide band as to provide acquisition of a channel so long as it can be distinguished from a neighboring channel; that is, ±500 kHz accuracy in the jam phase provides proper channel acquisition for this second phase. After the initial factory characterization, upon installation of the unit at a viewer's television receiver, the corrective and station-keeping control phases may be used by the installer to obtain more exact jam tuning by simply sequentially selecting each channel. To characterize these units, a precision comb generator signal, containing a nominal amplitude carrier at the picture carrier frequency for each channel can be applied to the control box 20 under characterization. By sweeping up stepwise from the lowest tuning frequency (voltage), the tuning voltage for the first channel can be found upon operation of the control box 20 and the corresponding signal entered in memory in the channel table 56 for that channel. Tuning voltages can be sequentially estimated from a channel previously characterized whereby the comb generator signal tunes within the acquisition range of the corrective control loop.

The control box 20 has three types of channel table memory. A read only memory (ROM) is used for the channel table 56 to permanently store program routines and initial tuning voltage estimates used at the start of the characterization process. A random access memory (RAM) is used for the channel table 56 as updated by the adaptive estimation control phase. Finally, an electrically erasable programmable read only memory (EEPROM) is used for the channel table memory to store the results of the initial factory characterization and, further, the updated RAM based channel table 56 can be written, from time to time, into the EEPROM.

The EEPROM, for example, may be written into once a day, as upon instruction from the supervisory facility during a quiescent period, such as in the middle of the night. One reason for this relatively infrequent updating is that the EEPROM can only be used for a limited number of write cycles. Another reason is that certain transitory variations in amplitude, such as flutter caused by airplanes or signal fades due to transient climatic conditions, such as thunderstorms, are to be ignored. To update the channel table in the EEPROM based upon such transients would actually impair its long term predictive accuracy.

Various types of information are stored in the RAM based channel table 56. Upon powering up from a power failure, the RAM based table 56 is refreshed from the EEPROM. One type of information stored is channel nomenclature. A second type of information, is tier membership which identifies channels the test viewer is allowed to select. For example, the test viewer is not permitted to select a substitute channel for general viewing. Channels not active in the receiving area may also be identified and precluded from selection.

A third type of information is the estimated DAC tuning voltages for frequency slewing. This information is stored for each channel as a 16 bit integer and represents the tuning voltages to be jammed into the local oscillator 46 for the respective channels. The estimated DAC tuning voltage signals stored in the EEPROM are periodically updated from the contents of the RAM based channel table 56.

A fourth type of information relates to the combined nonlinear sensitivities or gains of the picture carrier analyzer 26 and the local oscillator 46. This gain or range factor must be compensated for in the control loop 63. The factor is included in the channel table 56 because nonlinearities in the response of the local oscillator 46 can cause significant variations in this factor between channels.

A fifth type of information in the channel table 56 is the estimated gain control voltage which is to be jammed into the RF amplifier of the tuner 24A, 24B to get the desired signal amplitude. A signal corresponding to the estimated gain control voltage is stored as as eight bit integer in the EEPROM for loading into the RAM upon powering up of the control box 20. Updates of this estimated gain control voltage, stored in the RAM based channel table 56, based upon the output of the amplitude control loop 63 are periodically written into the EEPROM to update it.

A sixth type of information stored in the RAM channel table 56 is the estimated amplitude of the received channel signals. This information is stored in the RAM for signal matching purposes to determine the set point of the amplitude control loop, as will be explained later.

Other information in the channel table 56 includes the frequency set point for each channel. An installer may determine that the best picture for a particular channel is present if that channel is slightly detuned. This fine tuning set point information is stored as an 8 bit integer in the EEPROM for loading into the RAM channel table 56 upon powering up of the equipment. There are at least two reasons why a channel offers a better picture if slightly detuned. One relates to the imbalance between the luminance and the picture subcarriers in that channel. A second is the presence of potential undesirable beat interference from other channels. Reasons for such slight detuning are well known to those of skill in the art and need not be further discussed here other than to point out that the control box 20 offers this option.

OPERATION OF THE CONTROL BOX 20

One of the objectives of the present invention is to tune from a current channel to a selected channel so quickly that there is no distinguishable noise or degradation of the picture. If there be some slight degradation of the picture, such as poor color or contrast, it is to be removed in the most unobtrusive manner. Another objective is to compensate for long term variation, due to aging of components. The present invention also provides for matching the characteristics of a current channel and the channel selected for substitution so that, apart from the speed of the channel change, the channels appear to have equivalent visual quality. The signal characteristics which are controlled or matched include amplitude and signal to noise ratio.

Historically, frequency error for video signals has been considered a more severe problem than amplitude error or different signal to noise ratios. Frequency error causes loss of picture definition, and color can change or disappear. The automatic frequency control circuitry in the television set of the test viewer may attempt to correct the error, but it may correct the error in a very visible manner, such as by operating relatively slowly. Amplitude errors can also cause loss of synchronization or rolling of the picture. Amplitude errors can also cause shifts in contrast which test viewers may perceive as differences in picture definition. If the amplitude error is extreme, the automatic gain control of the television set may go into a station acquisition mode resulting in temporary sound muting. If the signal to noise ratios of the substitute channel and the normal channel are not matched, viewers perceive a signal with a higher signal to noise ratio as offering the better picture.

The combination of speed and accuracy is required particularly for unobstrusive frequency control. Because the desired speed and accuracy are somewhat inconsistent requirements, they cannot be realized with a single phase of operation. In the present invention, the controls are broken down such that speed with reasonable accuracy is first achieved, and then the required accuracy is realized more slowly. The first phase is the slew or jam phase in which the most recently estimated tuning voltage for the desired channel is jammed into the voltage controlled oscillator 46, causing the tuner 24A, 24B to slew towards the desired channel so rapidly that there is no audible indication of the change. The rapid tuning of a channel to within this range allows the receiver to recover the 4.5 MHz intercarrier frequency of the new channel without noise pop. This must occur in approximately 60 microseconds with a maximum error of approximately 500 kHz out of a potential slew range of 700 MHz. The switchable analog filter 60 is set in its wide bandwidth mode to achieve these rates.

The second phase of operation is the correction phase, in which it is desired to come within about 100 kHz of the desired frequency at a very fast rate, well under 100 milliseconds. It is acceptable if the tuning error is reduced to less than 200 kHz in substantially less than 200 milliseconds. The correction phase begins immediately upon or shortly after the jamming in of the predetermined control voltage. The correction phase is based on accepting that it is not possible to have the ultimate degree of accuracy required in the slew phase, given the wide frequency range of modern communication systems. However, in the correction phase, the objective is to correct any residual frequency error quickly and substantively before it can result in a visible picture degradation, as would be the case with the slow correction rate of the station-keeping phase. The switchable analog filter 60 is in the wide band mode during this section phase so that the effects of residual nonlinearities and hysteresis in that filter are also compensated by the second phase corrections.

The third phase of operation is the station-keeping phase, which has a relatively long time constant, on the order of 3 seconds. The purposes of this phase are to achieve the best possible tuning accuracy for the fourth phase, adaptive estimation, and to correct long term tuning drift due to aging of components or changes in the environment. It is performed so slowly as to be unobtrusive so long as the second phase has brought the tuning into acceptable limits. To achieve the level of desired accuracy, the analog filter 60 is placed in its narrow bandwidth mode to minimize the thermal and digital feedthrough noise generated in the DAC 58. In addition, the limit cycle or continuous cyclical hunting inherent in control loops may generate unacceptable additional interference components, such limit cycling is suppressed by utilizing a dead band or other equivalent limit cycle suppression technique.

The fourth control phase, adaptive estimation, provides updating of the characterization signals in the channel table 56 by use of a long term tuning control 213. This updating phase makes use of the information placed in the RAM channel table 56 during the station keeping phase and permits infrequent, perhaps once a day, updating of the characterization table in the EEPROM. The advantage of this is that the next time a respective channel is selected, the channel table 56 will more accurately reflect the actual tuning voltage required, so that the frequency error after the slew or jam phase will be much smaller than could be possible utilizing factory characterized values. This will minimize the corrections to be made during the second correction phase and hence make such corrections less obtrusive.

The result of these four phases of operation is that the tuner 24A, 24B selects the chosen channel with a minimum of visible or audible perturbation. In addition, adaptive estimation removes the onus for exacting accuracy from the factory characterization process. This eliminates the need for extreme measures to achieve the ultimate characterization accuracy. It allows the fast corrective phase controller to achieve sufficient accuracy, and this looser accuracy tolerance greatly increases characterization reliability. In addition, except for catastrophic faults, the adaptive estimation phase eliminates the need for removing the terminals from service and returning them to the factory for recalibration, an expensive procedure. The use of the EEPROM assures that relatively accurate estimation be preserved in the event of power failure.

There are certain instances when the EEPROM channel table is not updated because the output information is suspect. This is particularly true when there is a question whether the output signal represents video information or noise. A number of techniques can be used for detection by the signal presence detector 202. One is the employment of the video detector in the picture carrier analyzer 26 which looks for the sync pulses characteristic of composite sync. Another is the monitoring of the amplitude signal level of the television signal. If this signal has an unexpectedly low amplitude, the frequency control loop 63 can be frozen by a defeat signal until a signal of reasonable quality is again observed.

Another useful precaution is to limit the correction range of a ±500 kHz error range about the frequency expected from the jam phase. This prevents the frequency control loop from locking onto the sound carrier of an adjacent channel upon loss of signal from the desired channel. The adjacent channel sound carrier is only 1.5 MHz lower than the desired channel picture carrier and in over the air transmission may potentially be of level similar to that of an expected picture carrier. If such an erroneous lock were accidentally made, it would not necessarily be broken when the desired channel reappeared, resulting in a failure of the frequency control loop 63. The channel table 56 in the EEPROM should not be updated with such an erroneous tuning value.

With respect to amplitude, there is not such accuracy required as for frequency control. The total amplitude range to which a television receiver can respond is less than 50 dB, whereas the amplitude match between the current and selected channels need only be within about two dB. The most severe amplitude degradation problem is potential loss of sync due to amplitude mismatch between the previous and selected channels. See FIG. 8 for a graphic portrayal of the sync separation problem. Note that the sync pulses are recognized by their peak amplitude being in the top 2.5 dB of the television signal. Thus an amplitude step of more than 2 dB may trigger a sync loss fault. The automatic gain control of the television set 22, which is principally designed for removing airplane flutter, very quickly and efficiently removes any amplitude mismatch within this range (at a speed faster than the corrective phase of the control box 20). Because this exceeds the performance possible with the control box 20, the amplitude control sequence is terminated with the corrective phase. The analog filter 60 need not be switched and is left in its wideband mode.

FIG. 11 shows the dynamic response of the picture carrier analyzer 26. Note that even the slight mistuning present after the jam tuning phase would result in amplitude output errors due to the frequency response of the picture carrier analyzer bandpass filter 88, FIG. 9. The filter function amplitude corrector 84, FIG. 7, removes these tuning related errors in response to the frequency error signal, completely decoupling the frequency and amplitude control loops.

The adaptive estimation, or fourth control phase is significantly more complicated for amplitude control than for frequency control. As with the frequency control, a gain control voltage estimate, for each channel, is kept in the channel tabe 56, for use in the first or jam phase. A similar long term gain control 215 is used to update the RAM based channel table 56 gain control voltage estimate from the actual final value obtained upon exit of the corrective control phase of the feedback loop 63. Also similar to the frequency control loop, resulting RAM based channel table gain control voltage and signal level setpoint estimates are transferred from time to time to the nonvolatile EEPROM channel table. However, unlike in the frequency control loop, a number of signal transmission medium perturbations may create significant short term variations in these estimates. Several examples of such perturbations are signal level flutter induced by airplane multipaths and short term reductions in signal level due to heavy precipitation. Because of these perturbations, the estimated amplitude setpoint and gain control voltage values are averaged over many samples to remove short term variations before storing in the appropriate channel table field.

Like the frequency control, the amplitude control utilizes a signal level set point value stored in the channel table 56. The over the air television signal transmission medium results in a wide variation in received channel signal levels, potentially yielding a signal level range greater than the 50 dB range acceptable to television receiving equipment. A signal level estimator 226 utilizes both an observed picture carrier analyzer signal level from the filter function amplitude corrector 84, and an input signal level estimate obtained by dividing in a divider 228 the observed signal level by the gain setting signal from the control loop 63.

Figure 13A:
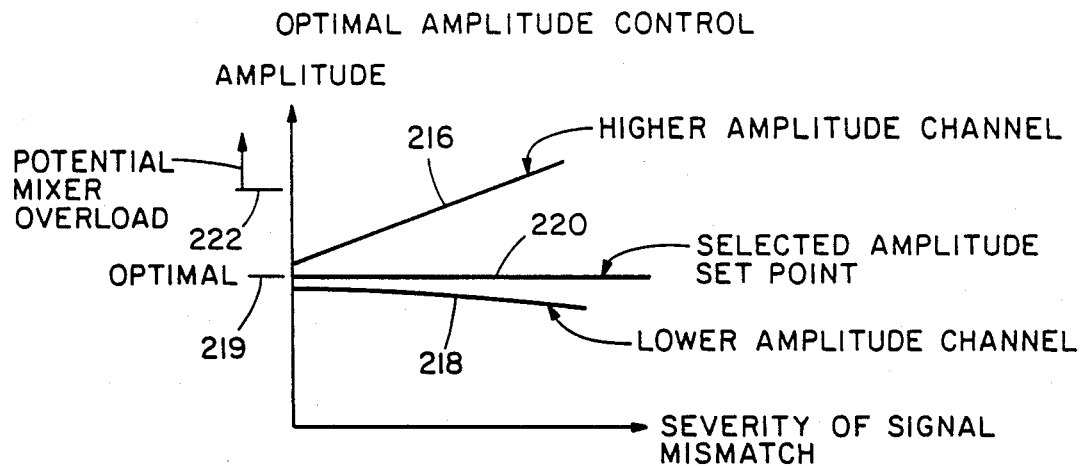
FIGS. 13A to 13C comprise curves illustrating the bases for amplitude control in signal matching for substituting substitute signals into a normal channel of a viewer's receiver utilizing the amplitude control loop shown in FIG. 7.
Figure 13B:
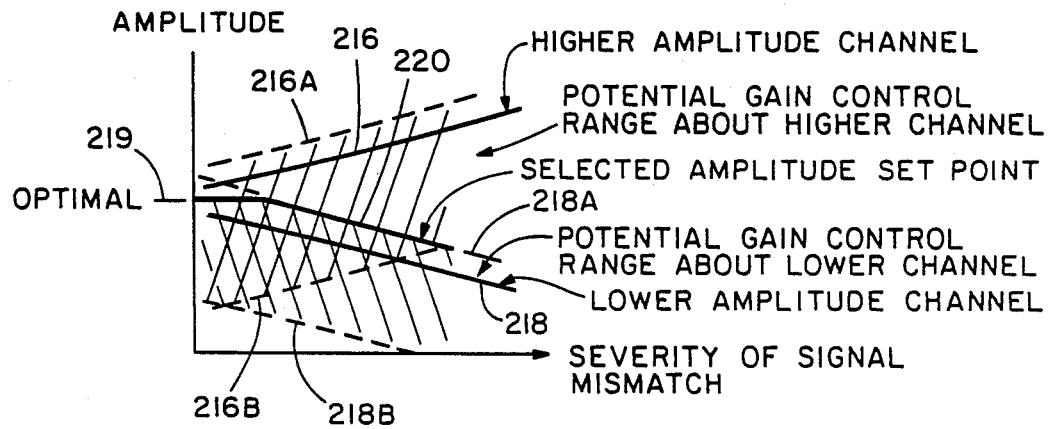
Figure 13C:
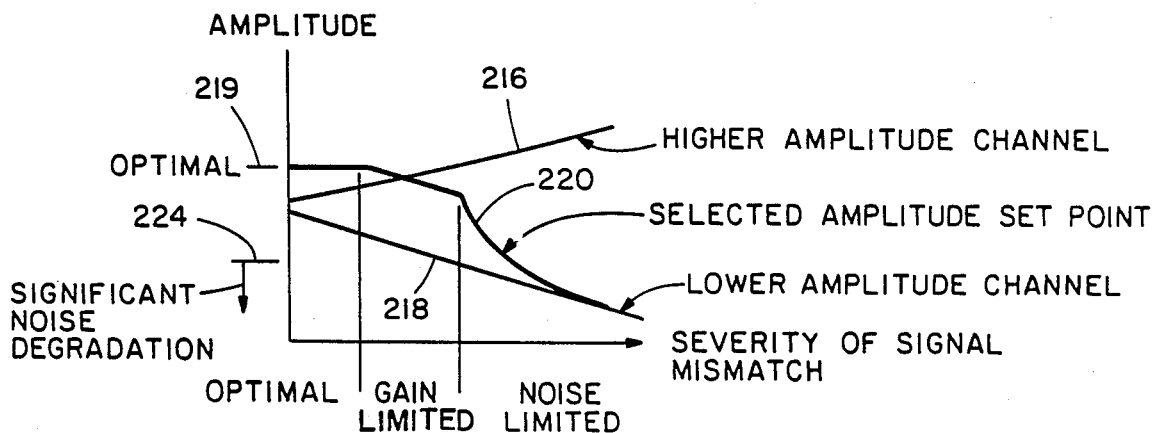

FIGS. 13A through 13C illustrate the signal criteria utilized by the signal level matching estimator 226. They show three aspects of the estimator, in each case showing signal amplitude for two channels as a function of severity of signal mismatch. That is, in going toward the right in each case, the signal 216 of greater amplitude rises and the signal 218 of lesser amplitude decreases to show the condition of greater difference or mismatch. The switching under consideration here is only for switching between a normal channel and a substitute channel. There is no need for signal matching when the viewer switches between channels. The best course then is always to provide an optimal signal level as most useful for the television receiver 22. It is only when there is to be a substitution that matching is needed to make an unobtrusive substitution. This matching problem includes switching back to the normal channel after the substitute message (commercial) is completed. Because the substituted signal is provided by the entity making the substitution, it may in every case be safely assumed that the signals in the substitute channel are made the stronger or are at least strong enough that the desired signal level is the level normally optimal. If this be so, there is never any occasion to degrade the signal in the normal channel.

FIG. 13A illustrates the case where classical automatic gain control philosophy can be used, namely, if observed input signal levels remain close to an optimal signal level 219, the optimal gain control strategy is to force the signal level to a set point 220 at that optimal value by using the tuner gain control loop 63.

The gain control of the tuner 24A, 24B has limited functionality because it is applied only to the RF amplifier stage 42 (FIG. 2). The RF amplifier 42 is provided normally in such mixer to control any excessively high signal levels before they could overload the mixer stage 44. That is, it assures a signal level to the mixer below the overload point 222. Hence, it has much greater range as an attenuator but has limited capability for gain increase. FIG. 13B shows signal conditions where the mismatch between the higher and lower signal levels exceeds the capability of the tuner gain control loop 63 to increase gain to achieve optimal signal level. The upper and lower limits of the range of signal level control of the respective signals 216 and 218 are shown at 216A and 216B and 218A and 218B, respectively. Because the gain of the signal 218 cannot be raised above the limit 218A, it is necessary to lower the amplitude of the signal 216, i.e., the signal in the substitute channel, to provide a match. Because, for unobtrusive signal substitition, signal matching has higher priority than signal level optimization, a consistent signal match is chosen at the expense of optimum output signal level. The set point 220 is then set at the limit 218A for this condition, which can be termed gain limited.

FIG. 13C illustrates the condition where the signal of lower amplitude is so weak as to be noticeably noisy. That is, the signal to noise ratio of the resulting signal at the television set 22 is so low as to provide a poor picture, e.g., being excessively snowy. It would not do to substitute a good picture, for this would be instantly noticed. Therefore, when the signal level of the signal 218 falls toward or beyond a level 224 of significant noise degradation, the strategy changes to reducing the set point 220 nearer to the level of the lesser signal 218, effectively making the stronger signal noisier by reason of thermal noise in the circuit, notably that created in the mixer 44. This transition is preferably done progressively because the lower the level of the lesser signal 218, the greater the need to make the signal in the substitute channel more like it in respect to signal to noise ratio.

In order to implement the signal matching criteria just described, the signal matching function is broken into two components. The first component, the signal level estimation, is performed by the signal level estimator 226 entirely on a channel by channel basis and is based upon estimating the input signal level of each channel. The input signal level is computed by dividing in the divider 228 a signal indicative of output signal amplitude by a signal indicative of the gain of the gain control 42. The latter is the gain control signal from the control loop 63 applied to the tuner 24A, 24B. The former is the linearized observed signal amplitude as sensed by the picture carrier analyzer 26, converted to a digital signal by the ADC 64, linearized by a digital amplitude linearizer 230 and corrected by the filter function amplitude corrector 84. Both of these signals are preferably presented logarithmically whereby the divider 228 may be implemented by a summer. Note that on a single channel basis, an optimal set point can be calculated based upon optimal output level for high signal levels, maximum available tuner gain for lower signal levels, and signal to noise matching criteria for very low signal levels. A complete transfer curve of this type can be seen in FIG. 13C in the relationship between the lower amplitude channel and the selected amplitude setpoint. This optimal set point function is incorporated into the algorithm for the signal level estimator 226. (The linearizer 230 compensates for non-linearity in the picture carrier analyzer 26. A similar linearizeer 234 is interposed at the input of the DAC 58 to precompensate for nonlinearities in the tuner 24A, 24B.)

The second part of the optimal amplitude control function is performed by a signal matching section 232, which is comprised of a set point corrector 232A and a gain voltage corrector 232B responsible for matching the current channel and the selected channel amplitudes, respectively. The three matching functions portrayed in FIGS. 13A–13C show that every instance of signal matching is performed by attenuating the stronger signal to a set point level which is controlled by the lower signal level. Thus the algorithms of the signal matching section 232 provide for selecting the lower set point of the two signals in question as the set point for the control loop 63 for both channels, and adjusting the tuning gain control jam value of the stronger channel to effect this reduction. Because the target application of this system is signal substitution for commercial testing, signal amplitude match need only be maintained between the channel selected by a viewer and the substitute signal. In this case as stated above, it can be assumed that the transmission path from the substitute signal transmitter to the viewer's home has been engineered so that the substitute signal is of high level. Hence, the signal level substitution will always be between a signal of lower or comparable amplitude to a high level signal and back. Under this case, the preceding control algorithms will always be stable.

As a consequence, it is necessary to determine only the input signal level of currently received signals in a currently received channel and generate a current amplitude signal indicative of such input signal level. The signal level of the substitute signal can be assumed adequate. Then the set point for the output signal level can be determined from the current amplitude signal corresponding to the normal channel most currently received. The set point and the signal output level can be used to generate a gain control signal maintaining the output level at the set point when there is a signal substitution. That is, before there is a signal substitution, the current amplitude signal controls the signal output level of the normal channel. Then upon switching to a substitute channel, the controlling amplitude signal is that for the normal channel most currently received by the viewer. This is applicable to successive signal substitutions. It is always the amplitude signal of the last normal channel received that is controlling.

The set point is set as a substantially monotonic function of the current amplitude signal corresponding to the most current normal channel, wherein the monotonic function has a positive slope at low amplitude. At low amplitude, the set point is set where the signal to noise levels of the normal and substitute signals upon signal substitution are substantially equal in the signal output of the tuning means. The set point is set at a predetermined fixed level when the current amplitude signal corresponding to the most current normal channel is relatively high and is set at progressively lower levels when the current amplitude signal corresponding to the most current normal channel is below a transition level. The set point is gain limited to the maximum signal output achievable by the gain control means for the normal channel.

The set point control is applied both to control the initial jamming signal and to control the feedback for amplitude control.

Following the jam phase, a fast correction phase is always needed because the jammed amplitude control estimate does not reflect short term signal amplitude perturbations, which must, therefore, be corrected in the correction phase.

Figure 15:
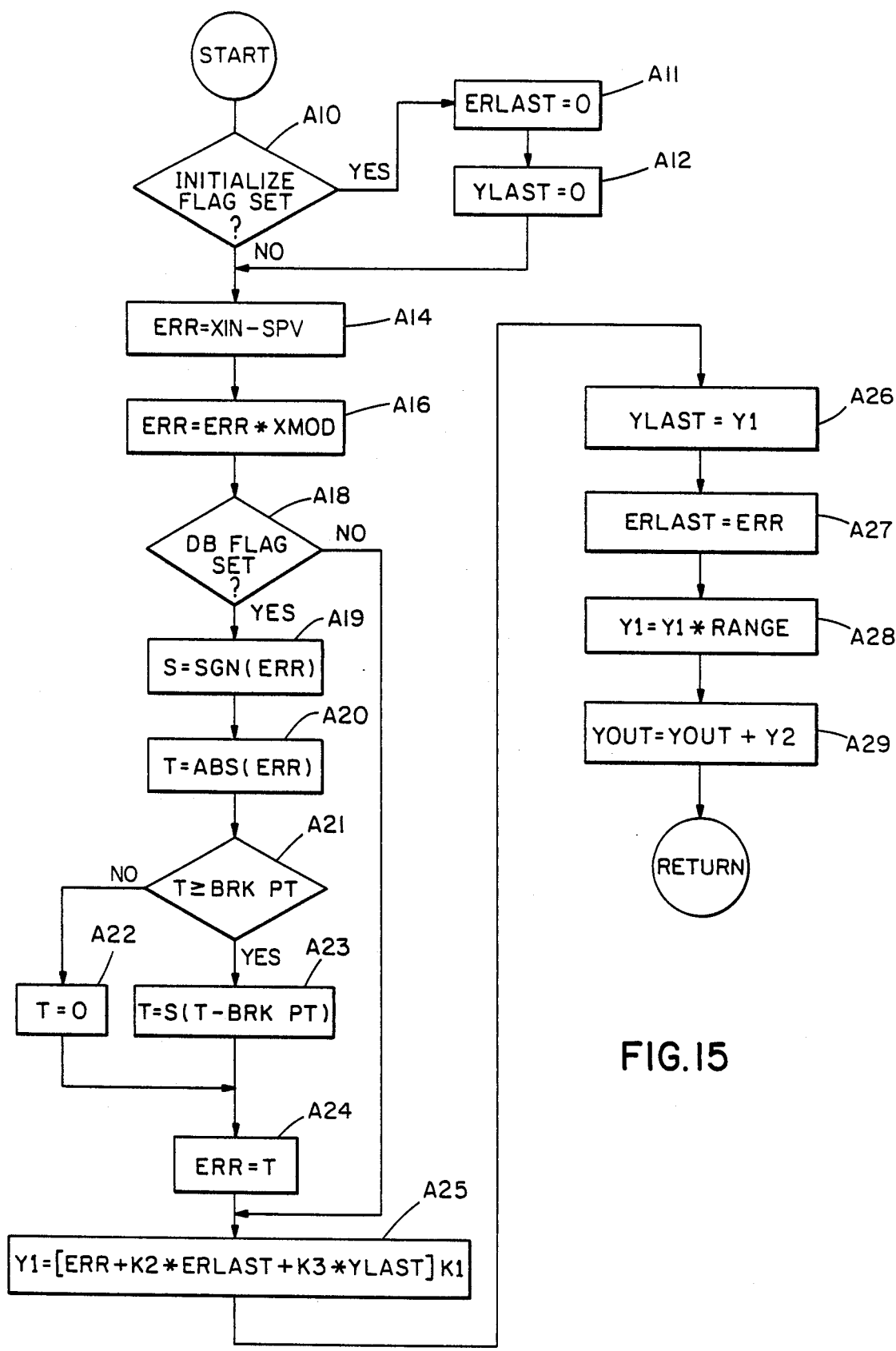
FIG. 15 is a flow chart diagram implementing the control loop filter and integrator shown in FIG. 14.
Figure 16:
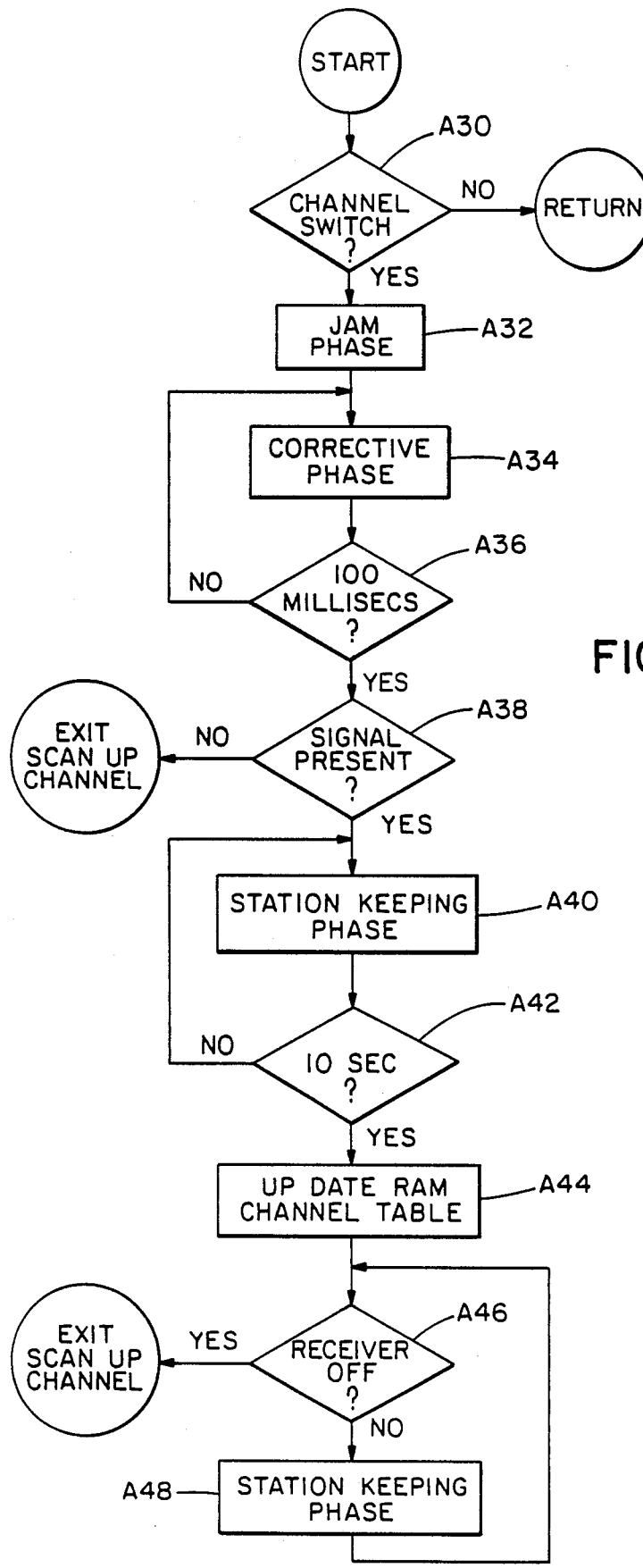
FIG. 16 is a flow diagram illustrating the sequencing of the frequency control loop by the control sequencer shown in FIG. 6.
Figure 17:
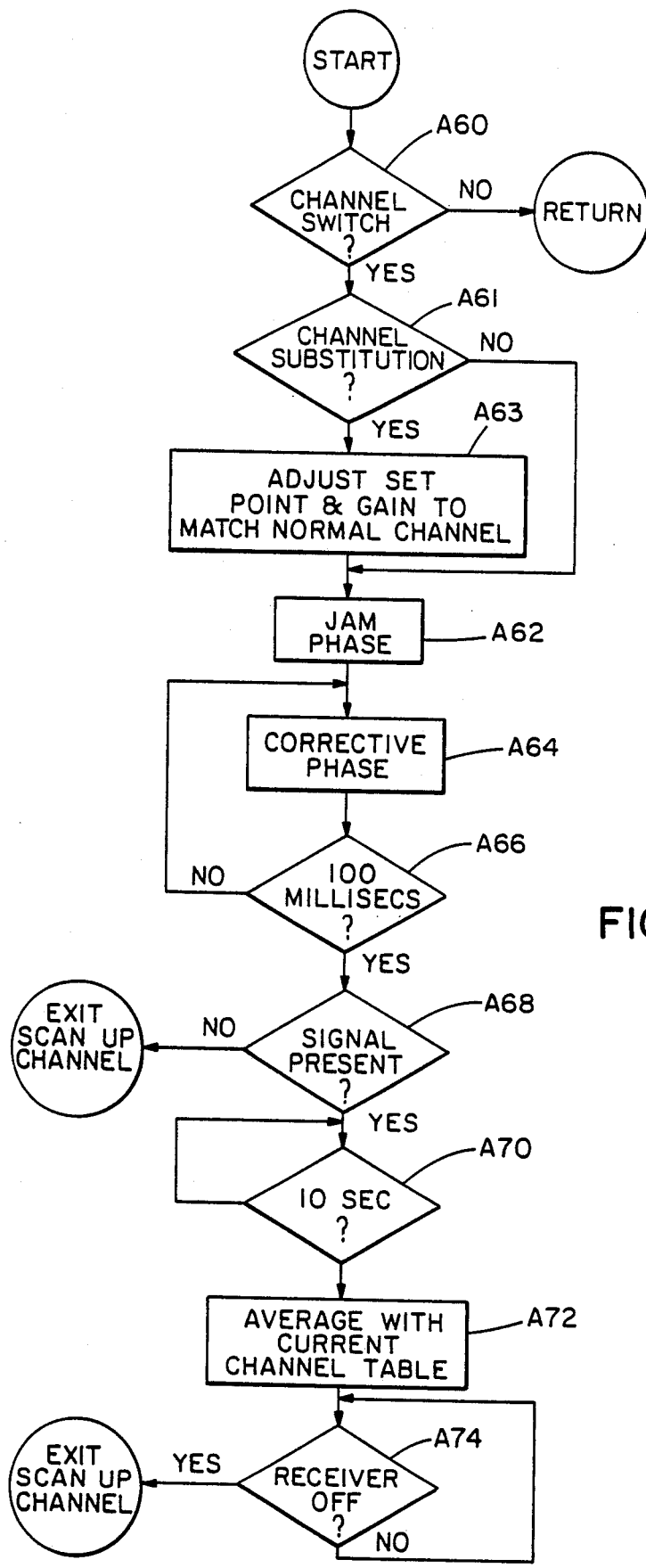
FIG. 17 is a flow diagram illustrating the sequencing of the amplitude control loop by the control sequencer shown in FIG. 7.

The preferred implementation of the above control functions, particularly the frequency and amplitude control loops 63, by software controlling the system control or microprocessor 28 will be explained in connection with FIGS. 14-17. The various routines or programs shown in FIGS. 15-17 are called by a system monitor which schedules foreground and background tasks for the television system of which the fast tuning subsystem is a part. In general, the control loop of FIG. 15 is scheduled on an interrupt basis once every predetermined period of time, in this instance every millisecond. The frequency control sequence routine of FIG. 16 and the amplitude control sequence routine of FIG. 17 implement the control sequencer 62. The implementation of the different phase occurs by changing the value of the variables in the control table 214 and executing the control loop of FIG. 15 based upon those variables. The calling of the control sequence routines in FIGS. 16 and 17 is the result of a trigger signal or channel change flag from the channel selector 54. The channel selector algorithm is scheduled by the system monitor on a real time basis and generates the channel change flag in response to the viewer's selecting a different normal channel or the control data calling for a channel substitution for the normal channel currently selected by the viewer. If the channel substitution command is given, the signal matching function of the amplitude control sequence program is enabled.

Figure 14:
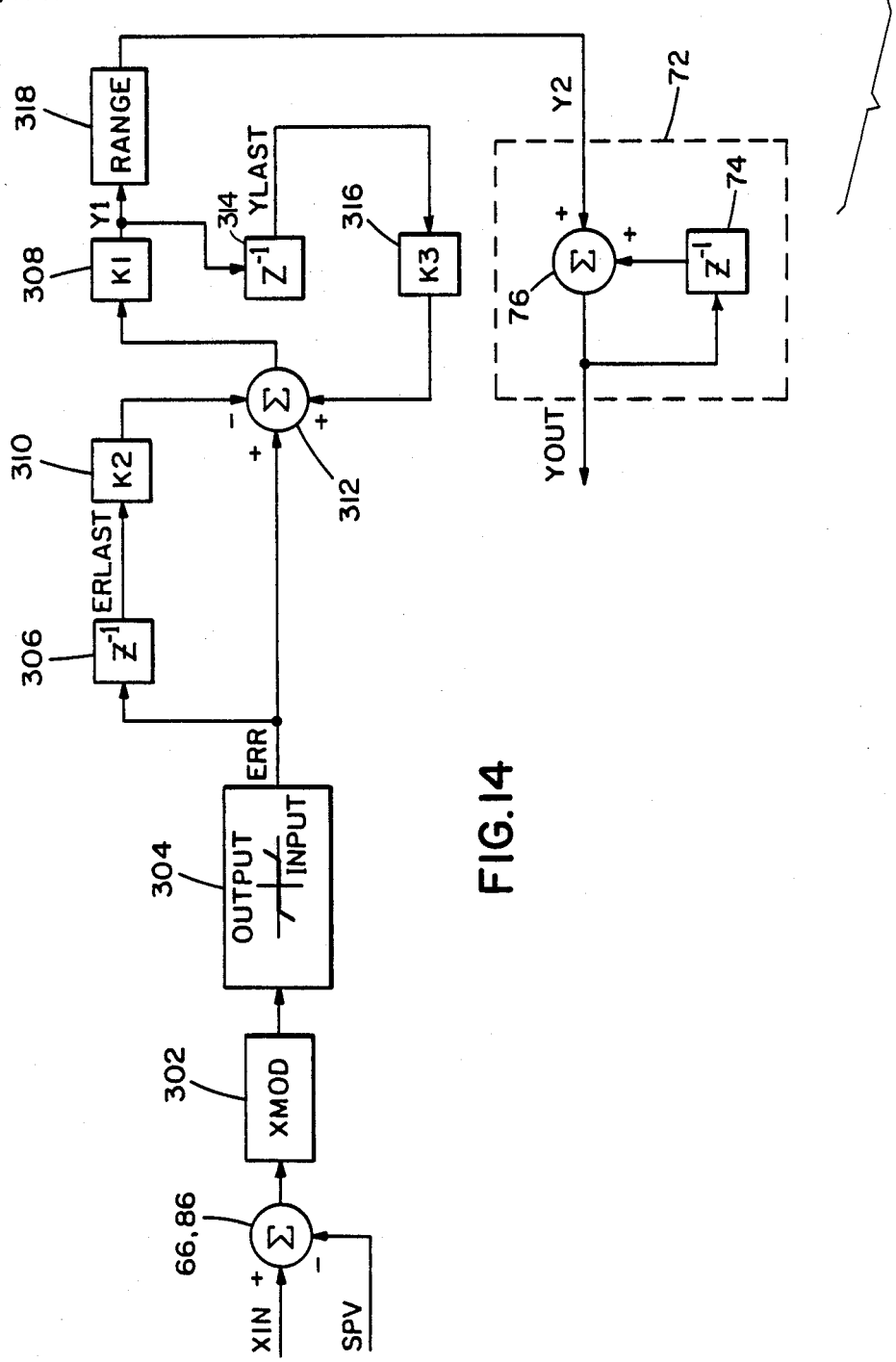
FIG. 14 is a block diagram of the implementation of the control loops shown in FIGS. 6 and 7.

Referring now to FIG. 14 there is shown a control block diagram of the digital control loop 63 implementing the following transfer function G(s):

$$G(s) = \frac{K(s+a)}{s(s+b)} \quad (1)$$

where Y(s)=G(S) X(s) s=Laplace variable, a and b are constants, K=proportional gain, Y(s)=output, and X(s)=input. The transfer function G(s) is a well defined control function which, if applied to an error signal X(s) describing the difference between a desired value of a parameter and the actual value of a parameter, will generate an output Y(s) causing a controlled system to smoothly and rapidly come to the desired value. The control, which in Equation (1) is expressed in the continuous frequency domain (s), is herein implemented by software in the microprocessor 28 in the discrete or digital domain (z). A digital implementation is an embodiment implemented either in digital circuitry or by software, preferably for use in the microprocessor 28.

In a discrete implementation the pole 1/s at the origin can be implemented as an integrator 72 comprising the summation junction 76 and the unit delay 74. The YOUT output from this part of the discrete implementation is the sum of the input Y2 and the previous value of the output YOUT, one clock period earlier.

The discrete implementation of the first stage 70 of the control loop 63 of FIG. 14 is that of the transfer function:

$$G1(s) = \frac{K(s+a)}{(s+b)} \quad (2)$$

The implementation is obtained by applying a bilinear transformation to transform the Laplace variable s to the discrete variable z which yields the equation:

$$Y(z) = \frac{1}{1+d} [K(1+c) X(z) + K(c-1) Z^{-1} X(z) \quad (3)$$
$$+ (1-d) Z^{-1} Y(z)]$$

where c and d are obtained from a and b by prewarping the S-plane frequency axis in accordance with the bilinear transformation definition.

The coefficients of the variables can be grouped into three adjustable tuning constants:

$$K1 = (1/(1+d))^*K(1+c)$$

$$K2 = [(1/(1+d))^*K(c-1)]/K1$$

$$K3 = (1/(1+d))^*K(1-d)/K1$$

If in FIG. 14 the input X(z) is defined as the error signal ERR, the second term in Equation (3) is implemented by delaying the error signal ERR in a delay unit 306 to become the previous error signal ERLAST before that signal is multiplied in a multiplier 310 by the coefficient K2. This signal along with the original ERR signal become addends for a summation junction 312. The last term of Equation (3) is implemented by feeding back the output signal Y1 through a delay unit 314 to produce a previous output signal YLAST which is then multiplied by the coefficient K3 in a multiplier 316. This signal is then added with the other two as one of the addends of the summing junction 312. The output Y1 is scaled by the coefficient K1 in a multiplier 308 and the RANGE coefficient in a multiplier 318 to produce the scaled, compensated error signal Y2. The RANGE coefficient compensates for the effective gain of the plant which is included in the feedback loop, i.e., the voltage controlled local oscillator 46 and the picture carrier analyzer 26. The scaled error signal Y2 is then coupled to the previously described discrete implementation of the pole 1/s and input to integrator 72.

The controller pole and zero positions can be adjusted by modifying the tuning constants K1, K2 and K3. K1, K3 represent the two pole locations of the transfer function while K2 represents the zero location of the function. The controller is initialized by presetting a value for the signal YOUT and by zeroing the values for the signals ERLAST and YLAST in the control table. In addition to the basic controller for nulling an error signal value ERR, a complete implementation as shown in FIG. 14 includes a means to modify the input variable XIN. The modified input variable XIN is first differenced in the summing junction 66, 86 with a respective set point value SPV. The difference is then scaled by a coefficient XMOD in a multiplier 302. In general XMOD takes on the value of either zero or one to disable and enable the control loop, respectively. The error signal ERR further passes through a dead band function generator 304 which can be switched into or out of the system control path. The dead band function generator, when enabled, provides a band of values for the input over which the output will remain constant. Such a dead band function is for preventing the controller from limit cycling.

The controller is implemented in software by a subroutine CONTR: which can be scheduled by other system programs. The subroutine CONTR: whose generalized flow chart is illustrated in FIG. 15 runs in an iterative fashion from values provided from a control table.

The control table is illustrated in FIG. 14 and comprises a portion of the working RAM of the microprocessor 28. The table is 17 bytes in length and includes a set point value SPV as the first byte followed by three double bytes for storing the constants K1, K2, and K3. The first byte of each double byte is the value of the respective tuning parameter and the second byte is the location of the binary point of the number stored in the first byte. The next two bytes store the input value XIN and its modification coefficient XMOD. A dead band flag is stored in the subsequent byte to enable and disable this function. The following byte stores the previous value of the error signal ERLAST and is followed by the present value of the first stage output Y1. Following these bytes is a byte which is representative of the previous value of the output of the first stage YLAST. The next byte contains the range variable followed by two bytes which are the output of the controller YOUT as a double precision number with the high byte preceding a low byte. The last byte in the table is an initialize flag which indicates whether the control is operating or has just been initialized.

When the subroutine CONTR: shown in FIG. 15 is called, it used the values from the control table to perform the control algorithm illustrated in FIG. 14. The program which schedules the subroutine CONTR: will either set or clear the initialize flag INIT before transferring control to the subroutine. The subroutine performs one iteration of the control loop every time it is called by an interrupt timer, every 1 ms.

In block A10 when control is passed to the CONTR: subroutine, the subroutine determines whether the initialize flage is set. If the flag is set, then this is the first pass or iteration through the control, and the previous error signal ERLAST and the previous output of the first stage YLASTR are zeroed in blocks A11, and A12. Otherwise, the program will execute blocks A14–A29 to implement the control function. The microprocessor 28 takes the input variable XIN loaded in the controller table, subtracts the set point value SPV from it in block A14, and then multiplies the result by the modification variable XMOD in block A16.

The program will thereafter either bypass blocks A18–A24 or execute the same based upon the value of the dead band flag set in the control table by the calling routine. A bypass operation is executed when the test in block A18 is failed, and program control is transferred to block A25. If the dead band function is to be enabled, the test in block A18 is passed and the function is inserted in the control path. In general, the function is enabled only during the long term station keeping phase of the frequency control sequence.

The dead band function is implemented by first finding the sign function SGN and absolute value function ABS of the scaled signal ERR in blocks A19 and A20, respectively. Next it is determined whether the value of the error signal is greater than or equal to the break point value BRK PT of the dead band function in block A21. If the value is less, then the error should be set to zero in block A22 to prevent limit cycling. If the value is more, then the error should be signed and have the break point value BRK PT subtracted from it in block A23. The signed value of the error can be additionally multiplied by a slope value s in block A23, but because of the previous ability of the loop to scale the error in block A16, the actual scale factor of the preferred embodiment is one. The error value ERR as calculated in block A24 from either block A22 or block A23 is thereafter used to further operate the control loop.

The output of the first stage Y1 is formed in block A25 by a summation of the three factors that make up the first part of the controller. By using the previous values ERLAST and YLAST, the delay function $Z^{-1}$ of the controller is implemented in this step. The previous variables YLAST and ERLAST are then substituted in blocks A26 and A27 with the present values of the output Y1 and error signal ERR. These values are restored into the control table so that at the next pass through the control program the present values will become the previous values.

The program then scales the output Y1 by multiplying it by the range variable RANGE in block A28. After proper scaling to produce a number which can drive the digital to analog converter 58, the present output YOUT is generated in block A29 as the previous output YOUT plus the present scaled output Y2 of the first stage. YOUT is represented to 16 bit accuracy;

however, all previous control variables need only be represented to 8-bit accuracy. This completes one pass through the control subroutine and the program is called reiteratively to provide the control illustrated in FIG. 14. The scheduling program which calls the subroutine CONTR: is responsible for the timing of its call to produce the correct time constants for the control loop 63.

The frequency control sequence and the amplitude control sequence use this identical control implementation for each of the various phases of their sequences. By appropriate choices of the constants K1, K2, and K3, the various poles, zeroes, and time constants and other characteristics required for each control phase or type of control can be implemented with this single control loop. The programmability of the digital implementation and the ability to multiplex the same control structure simultaneously to implement an amplitude and frequency controller provide a significant hardware savings.

In FIG. 16, there is shown the frequency control sequence which is called when the system desires to switch channels. The switching of the channel by the channel selection routine will cause an initialization of the control table to those constants needed to implement frequency control for that particular chosen channel. In general, the control table receives the range variable and an initial control voltage estimate for YOUT for the frequency control sequence depending upon the channel which is to be switched to.

Further, the set point information for the particular channel which is stored in the channel table is loaded into the control table. This information has to do with the variations from the optimal frequency control values stored in the channel table. These variations could be the result of fine tuning considerations or because of other considerations relating to the local oscillator 46 in the converter 24A, 24B. These considerations include compensation for drift due to the aging of components or initial miscalibration.

Once the control table is loaded with the channel variables, the frequency control sequence is initiated in block A30, and the program begins a test of whether the channel selection routine has switched channels. If a negative answer is produced, the subroutine terminates. If an affirmative answer is produced, then a JAM phase in block A32 of the frequency control sequence is initiated. The JAM phase of the frequency control sequence includes setting the output value YOUT to the jam voltage from the channel table 56 for the particular selection. Further, the initialization flag is set to produce a zeroing or initialization of the previous error signal and previous output of the first stage, ERLAST and YLAST, respectively. The constants K1, K2, and K3 from the controller table are set, and a value read from the picture carrier analyzer (PCA) 26 is inserted for the input value XIN. The JAM phase completes by setting values of the subroutine CONTR: to execute, sending the jam voltage to the tuners 24A and 24B, and to initialize the controller. When the jam voltage is sent to the local oscillator 46, the analog filter 60 is also switched into the wideband mode.

Next in block A34 the CORRECTIVE phase begins by first clearing the initialization flag and then by setting values of the subroutine CONTR: to begin a reiterative frequency control for 100 milliseconds. Block A36 provides a timer which loops after the calling of the subroutine so that this phase of the control is executed for the 100 millisecond time period. This operation is for a short term channel frequency acquisition tuning.

For this process, the control must correct for tuning errors as measured by the picture carrier analyzer 26 after jamming the original control value which slews the tuner to within ±500 kHz of the target frequency. The control in this configuration has an inherent 10 millisecond first order pole. In addition, another 2 millisecond filter delay is introduced between the digital to analog converter 58 and the tuners 24A and 24B. Because all other delays in the tuning system are negligible, the control is implemented as a simple proportional control with a loop gain of one. This is an effective control as long as the measurement delay of the picture carrier analyzer 26 is compensated for.

A compensator for the control is designed to compensate for the fact that the frequency error measurement is not instantaneous. Because the picture carrier analyzer 26 and the tuners 24A and 24B are within the control loop, they are lumped together as a pole to set one of the constants in the control table. A compensator and opposite cancelling zero are used to generate the constant K2 for the control table. If in a preferred example, the PCA pole and the DAC-tuner pole are lumped together to give a single 12 millisecond pole, then in the frequency domain this occurs in the s-plane on the s-axis at s=−83.3.

The transfer function of this pole may be represented as:

$$Hp(s) = \frac{1}{(s + 83.3)} \qquad (4)$$

and the desired compensator is a cancelling zero:

$$Hz(s) = (s + 83.3).$$

When these transfer functions are combined and transformed into the discrete time domain with the bilinear transform, one obtains:

$$Y(z) = 1.2853 \cdot X(z) - 0.7147 \cdot Z^{-1}X(z) - Z^{-1}Y(z) \qquad (5)$$

From inspection of Equation (5) we can determine the controller tuning constants:

$$K1 = 1.2853,$$

$$K2 = -0.7147, \text{ and}$$

$$K3 = -1.0.$$

After this corrective phase of the control has been applied, its action will move the frequency to at least within 100 kHz of the desired frequency value. The frequency control sequence will then test whether a video signal is present in block A38. The test generally is to determine whether a horizontal sync signal of the video occurs within specified scan rate window. If there is no signal preset, then the program exits back to the scan up channel routine. However, if the signal is present, then the program enters a station keeping phase in block A40.

In block A40 the initialization value is cleared, the output value YOUT is maintained, and the set point value SPV is set to zero. The controller constants are thereafter refreshed to produce a controller with a longer time constant for settling. The dead band flag is set during this phase to enable the dead band function 304 in order to eliminate objectionable limit cycling. The analog filter 60 is also switched to the narrow band mode. Once the initialization of the control table is accomplished, the station keeping phase calls the control program CONTR: and begins a reiterative control for 10 seconds as timed by block A42.

The long term station keeping control function is given by the transfer function:

$$H(s) = \frac{Kp}{s(s + a)} \qquad (6)$$

where Kp is proportional gain, a is a constant, s is a Laplace variable, and $H(s) = Y(s)/X(s)$. The value of Kp, the time constant of the television receiver, i.e., the settling time objective, and the frequency of the execution of the control loop are chosen to avoid overdriving the maximum slew rate of the television receiver or response to changes in timing frequency. This slew rate is defined by the maximum step change in frequency which the television receiver can track without significant picture degradation. In addition, the digital to analog converter output is limited to a deviation of ±500 kHz from the characterized digital to analog converter value recorded in the EEPROM. The output limiting is disabled when no channel table definition has been recorded in the EEPROM.

Given a target settling time of 2 seconds and an execution period of 2 seconds, the control tuning parameters are as follows:

K1=0.9914,

K2=0.9914, and

K3=0.9828.

Once the long term station-keeping phase has brought the frequency as close as possible to the target frequency, the frequency control sequence goes through an update phase in block A44. The preset control voltage stored in the working RAM space is replaced by the value presently applied to the DAC 58 that balances the loop. This adaptive value is stored in the EEPROM approximately once a day to update the original channel table value which, because of aging of components and other variables, may drift.

Thereafter, in block A46 the program tests to determine whether the television receiver 22 is off. If it is, the scan mode is initiated and the program will exit to the channel selection routine. However, if the receiver is not off or not in scan mode, the program will loop to block A48 and the station-keeping phase, where it will continue to look for commands to change channels or scan.

The amplitude control sequence as shown in FIG. 17 is similar to the frequency control sequence in that it has a control sequence including a JAM phase in block A62 and a corrective phase in block A64. The amplitude control sequence includes a test for whether channel switching is desired in block A60 such that the amplitude needs to be controlled to a new value. If a substitute channel is being substituted, its set point and initial gain values are matched to those of the previously viewed normal channel in block A63 before proceeding to the JAM phase in block A62. If a substitute channel is not being substituted, the subroutine proceeds directly to the JAM phase. In the initial JAM phase in block A62, the variables K1-K3, the range variable, initialization flag, and a jam value are loaded into the control table. Further, the set point SPV, having a value in accordance with the various criteria of the signal matching discussed with reference to FIGS. 13A-13C is loaded into the control table.

After an initial pass through the subroutine CONTR: for the JAM phase, the program passes to the corrective phase in block A64 where the initialization flag is cleared, and the control loop is iteratively executed to perform a settling based on the calculated set point for 100 milliseconds. This timing is kept by a timer which is tested in block A66. After timing out, the next block A68 tests whether a video signal is present. If no video signal is present, then the program exits to the scan up channel routine. However, if there is a video signal present, then the amplitude output to the DAC 59 is held for 10 seconds as timed by block A70.

After stabilization, the output of the amplitude control is used to update the amplitude value for the channel in the channel table. Instead of just replacing the amplitude value from the last pass through the amplitude control sequence, the present value is averaged with the past value by adding only a fraction of the present amplitude value to a fraction of the past value. The program then sequences to block A74 where the system is tested to determine whether the television receiver is turned off and whether the system is in a scan mode. In response to an affirmative answer to this test, the program will exit to the scan up channel routine. Otherwise, if this question is answered negatively, the program will loop back to block A74 to repeat the test.

Although certain preferred embodiments of the invention have been set forth in some detail, various modifications may be made within the scope of the invention. For example, the gain control 42 may be a controlled attenuator. The mode control may change the feedback to the station-keeping mode after the control mode has brought the error below a predetermined limit instead of after a predetermined time. The picture carrier analyzer 26 may analyze the output signals from the tuner 24A, 24B after the second converter 40 for the purposes of control.

What is claimed is:

1. A fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including an associated memory means in which is stored signals corresponding to respective voltage signals predicted for applying to said oscillator to tune said tuner to receive the channel frequencies of the respective channels, and further including means interconnected between said memory means and said control input of said oscillator for applying a selected one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal; error detecting means for generating a tuning error signal indicative of the tuning error of the tuner off the frequency for the selected channel; and feedback means for combining said tuning error signal with said selected predicted voltage signal to provide a control signal at said control input for adjusting said channel frequency to reduce said tuning error, said feedback means having a correction mode and a station-keeping mode, said correction mode providing correction of any error in tuning of an acquired channel fast enough that the correction is substantially imperceptible to the eye and any residual error is substantially imperceptible to the eye, and said station-keeping mode operating slowly enough to filter out noise and spurious signals and maintain any residual error below a predetermined limit over long periods of time; and means for controlling the mode of said feedback means to enter the correction mode upon or shortly after application of said one of said predicted voltage signals and later to enter the station-keeping mode.

2. A subsystem according to claim 1 wherein said means for controlling the mode operates to place said feedback means in said station-keeping mode a predetermined time after application of said one of said predicted voltage signals.

3. A subsystem as set forth in claim 1 wherein said means for controlling the mode operates to place said feedback means in said station-keeping mode upon said error being below a predetermined limit in said corrective mode.

4. A fast tuning subsystem according to any one of claims 1 to 3 further including means for storing in said memory means updated signals corresponding to the control signals applied to said control input for respective channels after the settling of said feedback means in said station-keeping mode, said updated signals being stored as said signals corresponding to respective voltage signals in lieu of the corresponding prior stored signals.

5. A fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including an associated memory means in which is stored signals corresponding to respective voltage signals predicted for applying to said oscillator to tune said tuner to receive the channel frequencies of the respective channels with an accuracy within about 500 kHz, and further including means interconnected between said memory means and said control input of said oscillator for applying one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal in less than about 100 microseconds; error detecting means for generating a tuning error signal indicative of the tuning error of the tuner off the frequency for the selected channel; feedback means for combining said tuning error signal with said selected predicted voltage signal to provide a control signal at said control input for adjusting said channel frequency to reduce said tuning error; and means for controlling the response time and bandwidth of said feedback means to provide a relatively fast response time and wide bandwidth for a period of time after application of said one of said respective predicted voltage signals to said control input to reduce any tuning error to less than about 200 kHz in substantially less than 200 milliseconds, and thereafter providing a relatively slow response time and narrow bandwidth to maintain any residual tuning error less than a predetermined limit over long periods of time.

6. In a fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including an associated memory means in which is stored signals corresponding to respective voltage signals predicted for applying to said oscillator to tune said tuner to receive the channel frequencies of the respective channels, and further including means interconnected between said memory means and said control input of said oscillator for applying a selected one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal; error detecting means for generating a tuning error signal indicative of the tuning error of the tuner off the frequency for the selected channel; and feedback means for combining said tuning error signal with said selected predicted voltage signal to provide a control signal at said control input for adjusting said channel frequency to reduce said tuning error: the improvement comprising means for controlling the response time of said feedback means to provide a relatively fast response time for a period of time after application of said one of said respective predicted voltage signals to said control input and thereafter a relatively slow response time, said period being sufficiently long that transients in the slew mode of said predictive means do not perturb the long term feedback mode of said feedback means substantially.

7. In a fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including an associated memory means in which is stored signals corresponding to respective voltage signals predicted for applying to said oscillator to tune said tuner to receive the channel frequencies of the respective channels, and further including means interconnected between said memory means and said control input of said oscillator for applying a selected one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal; error detecting means for generating a tuning error signal indicative of the tuning error of the tuner off the frequency for the selected channel; feedback means for combining said tuning error signal with said selected predicted voltage signal to provide a control signal at said control input for adjusting said channel frequency to reduce said tuning error; and means for disabling said feedback means for a predetermined period of time after application of said one of said respective predictive voltage signals to said control input, said predetermined period being sufficiently long that the detected transients in the slew mode of said predictive means do not perturb the long term feedback mode of said feedback means substantially.

8. In a fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including associated memory means in which is stored signals corresponding to respective voltage signals predicted for applying to said oscillator to tune said tuner to receive the channel frequencies of the respective channels, and further including means interconnected between said memory means and said control input of said oscillator for applying a selected one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal; error detecting means for generating a tuning error signal indicative of the tuning error of the tuner off the frequency for the selected channel; and feedback means for combining said tuning error signal with said selected predicted voltage signal to provide a control signal at said control input for adjusting said channel frequency to reduce said tuning error: the improvement comprising means responsive to said tuning error signal for automatically and from time to time changing the signals stored in said memory means for respective channels to signals corresponding to the control signals applied to said control input after long term operation of said feedback means upon receipt of frequencies of the respective channels.

9. Apparatus according to claim 8 wherein said stored signals are stored in digital form and said means interconnected between said memory means and said control input comprises a precision digital to analog converter.

10. In a fast tuning subsystem for use in switching from a current channel to a selected channel of a television system, said tuning subsystem comprising a tuner for selecting a channel to be received, said tuner including a voltage controlled oscillator having a control input for determining, in response to a control voltage applied to said control input, the channel frequency said tuner selectively receives; predictive means for supplying a selected predicted voltage signal to said control input of said oscillator, said predictive means including associated memory means in which is stored signals corresponding to respective voltage signals predicted for applying to said oscillator to tune said tuner to receive the channel frequencies of the respective channels, and further including means interconnected between said memory means and said control input of said oscillator for applying a selected one of said respective predicted voltage signals as said selected predicted voltage signal to said control input of said oscillator, said oscillator being responsive to said selected predicted voltage signal to slew the channel frequency at a rapid slew rate to the frequency corresponding to said selected predicted voltage signal; error detecting means for generating a tuning error signal indicative of the tuning error of the tuner off the frequency for the selected channel; and feedback means for combining said tuning error signal with said selected predicted voltage signal to provide a control signal at said control input for adjusting said channel frequency to reduce said tuning error: the improvement comprising means for automatically and from time to time storing in said memory means updated signals corresponding to the control signals applied to said control input for respective channels after settling of said feedback means, said updated signals being stored as said signals corresponding to respective voltage signals in lieu of the corresponding prior stored signals.

11. Apparatus according to any one of claims 8 to 10 wherein said tuner includes gain control means having a gain control input, said gain control means being responsive to a gain control signal applied to said gain control input for controlling the signal level of the output of said tuner, said predictive means includes means for supplying a selected predicted gain control signal to said gain control input, said associated memory means stores signals corresponding to respective gain control signals predicted for respective channels for providing a predetermined said signal level, said predictive means includes means interconnected between said memory means and said gain control input for applying a said respective predicted gain control signal to said gain control input corresponding to the selected channel, said error detecting means includes means for generating an amplitude error signal indicative of the amplitude error of the signal level output relative to a set point, said feedback means includes means for combining said amplitude error signal with said selected predicted gain control signals to adjust said signal level output to reduce said amplitude error.

12. Apparatus according to claim 11 further comprising means for automatically and from time to time changing the signals stored in said memory means for respective channels to signals corresponding to gain control signals applied to said gain control means after long term operation of said feedback means.

13. Apparatus according to claim 12 comprising means for determining the input signal levels of said tuner for respective channels and for adjusting said set point in response thereto.

14. Apparatus according to claim 11 comprising means for determining the input signal levels of said tuner for respective channels and for adjusting said set point in response thereto.

15. A fast tuning subsystem for use in switching from a current channel to a selected channel of a television system, said tuning subsystem comprising a tuner for selecting a channel to be received, said tuner including gain control means having a gain control input, said gain control means being responsive to a gain control signal applied to said gain control input for controlling the signal level of the output of said tuner; predictive means for supplying a selected predicted gain control signal to said gain control input, said predictive means including associated memory means for storing signals corresponding to respective gain control signals predicted for respective channels for providing a predetermined said signal level, and further including means interconnected between said memory means and said gain control input for applying a respective predicted gain control signal to said gain control input corresponding to the selected channel; error detecting means for generating an amplitude error signal indicative of the amplitude error of the signal level output relative to a set point; and feedback means for combining said amplitude error signal with said selected predicted gain control signals to adjust said signal level output to reduce said amplitude error.

16. A fast tuning subsystem according to claim 15 further comprising means for automatically and from time to time changing the signals stored in said memory means for respective channels to signals corresponding to gain control signals applied to said gain control means after long term operation of said feedback means.

17. A subsystem according to either one of claims 15 and 16 for determining the input signal levels of said tuner for respective channels and for adjusting said set point in response thereto.

* * * * *

UNITED STATES PATENT AND TRADEMARK OFFICE
CERTIFICATE OF CORRECTION

PATENT NO. : 4,748,684
DATED : May 31, 1988
INVENTOR(S) : W. Andrew Wright, Jr.

It is certified that error appears in the above-identified patent and that said Letters Patent is hereby corrected as shown below:

```
Column 1,   line 13, change "signal" to --signals--;
            line 52, change "to" to --with--.
Column 2,   line 24, change "picture" to --video--;
            line 62, change "+" to --±--.
Column 5,   line 19, change "said" to --the--.
Column 8,   line 3, change "hetrodyne" to --heterodyne--.
Column 9,   line 43, after "to" insert --components of--;
            line 44, delete "components of".
Column 11,  line 49, change "acitve" to --active--.
Column 12,  line 6, after "7" insert semi colon;
            line 63, change "Min" to --M in--.
Column 13,  line 58, delete "by the summer 66".
Column 14,  line 26, after "next" insert --time the--.
Column 15,  line 40, change "as" (second occurrence) to
--an--.
Column 17,  line 4, change "section" to --second--;
            line 21, change "components, such" to
--components. Such--.
Column 19, line 15, after "signal" insert --matching--;
            line 16, delete "matching";
            line 33, change "substituted" to --substitute--.
```

UNITED STATES PATENT AND TRADEMARK OFFICE
CERTIFICATE OF CORRECTION

PATENT NO.  : 4,748,684
DATED       : May 31, 1988
INVENTOR(S) : W. Andrew Wright, Jr.

It is certified that error appears in the above-identified patent and that said Letters Patent is hereby corrected as shown below:

```
Column 20, line 45, change "setpoint" to --set point--.
Column 21, line 67, change "phase" to --phases--.
Column 22, line 20, change "G(S)" to --G(s)--;
           line 20, after "X(s) insert a comma.
Column 23, line 4, change "along with" to --and--;
           line 35, after "general" insert a comma.
Column 24, line 5, change "used" to --uses--;
           line 17, change "YLASTR" to --YLAST--;
           line 20, change "controller" to --control--;
           line 45, change "s" to --S--.
Column 25, line 55, change "controller" to --control--.
Column 26, line 59, change "preset" to --present--.
Column 27, line 24, delete the period.
Column 31, line 11, change "predictive" to --predicted--.
```

Signed and Sealed this

Twenty-eighth Day of February, 1989

*Attest:*

DONALD J. QUIGG

*Attesting Officer*    *Commissioner of Patents and Trademarks*